(12) United States Patent
Kawase et al.

(10) Patent No.: US 9,508,648 B2
(45) Date of Patent: Nov. 29, 2016

(54) THREE-DIMENSIONAL INTEGRATED CIRCUIT LAMINATE, AND INTERLAYER FILLER FOR THREE-DIMENSIONAL INTEGRATED CIRCUIT LAMINATE

(71) Applicant: MITSUBISHI CHEMICAL CORPORATION, Minato-ku (JP)

(72) Inventors: Yasuhiro Kawase, Kitakyushu (JP); Makoto Ikemoto, Kitakyushu (JP); Hideki Kiritani, Kitakyushu (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 14/041,341

(22) Filed: Sep. 30, 2013

(65) Prior Publication Data

US 2014/0027885 A1 Jan. 30, 2014

Related U.S. Application Data

(63) Continuation of application No. PCT/JP2012/058676, filed on Mar. 30, 2012.

(30) Foreign Application Priority Data

| Mar. 31, 2011 | (JP) | 2011-080752 |
| Mar. 31, 2011 | (JP) | 2011-080753 |
| Mar. 31, 2011 | (JP) | 2011-080754 |
| Mar. 31, 2011 | (JP) | 2011-080755 |
| Mar. 31, 2011 | (JP) | 2011-080756 |

(51) Int. Cl.
*H01L 21/56* (2006.01)
*H01L 23/29* (2006.01)
(Continued)

(52) U.S. Cl.
CPC ......... *H01L 23/5329* (2013.01); *H01L 21/563* (2013.01); *H01L 23/29* (2013.01);
(Continued)

(58) Field of Classification Search
CPC .... H01L 21/563; H01L 23/295; H01L 25/0657
USPC ..................... 257/684, 729, 795
See application file for complete search history.

(56) References Cited

U.S. PATENT DOCUMENTS

| 6,207,296 B1 * | 3/2001 | Higuchi et al. ............... 428/620 |
| 8,017,444 B2 * | 9/2011 | Inada et al. ................... 438/118 |

(Continued)

FOREIGN PATENT DOCUMENTS

| JP | 10-107204 A | 4/1998 |
| JP | 11-140166 A | 5/1999 |

(Continued)

OTHER PUBLICATIONS

"Electro Packaging Technologies" CMC Publishing Co., Ltd., 2003, 4 Pages.

(Continued)

*Primary Examiner* — George Fourson, III
(74) *Attorney, Agent, or Firm* — Oblon, McClelland, Maier & Neustadt, L.L.P.

(57) ABSTRACT

To provide a three-dimensional integrated circuit laminate filled in with an interlayer filler composition having both high thermal conductivity and low linear expansion property, a three-dimensional integrated circuit laminate, which comprises a semiconductor substrate laminate having at least two semiconductor substrates each having a semiconductor device layer formed thereon laminated, and has a first interlayer filler layer containing a resin (A) and an organic filler (B) and having a thermal conductivity of at least 0.8 W/(mrK) between the semiconductor substrate.

24 Claims, 2 Drawing Sheets

(51) Int. Cl.
*H01L 23/31* (2006.01)
*H01L 25/18* (2006.01)
*H01L 23/532* (2006.01)
*H01L 25/065* (2006.01)
*H01L 23/00* (2006.01)

(52) U.S. Cl.
CPC ........ *H01L 23/295* (2013.01); *H01L 25/0657* (2013.01); *H01L 24/05* (2013.01); *H01L 24/11* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/05009* (2013.01); *H01L 2224/0557* (2013.01); *H01L 2224/05644* (2013.01); *H01L 2224/05647* (2013.01); *H01L 2224/05655* (2013.01); *H01L 2224/06181* (2013.01); *H01L 2224/11334* (2013.01); *H01L 2224/11462* (2013.01); *H01L 2224/13025* (2013.01); *H01L 2224/13147* (2013.01); *H01L 2224/16145* (2013.01); *H01L 2224/16146* (2013.01); *H01L 2224/16225* (2013.01); *H01L 2224/16227* (2013.01); *H01L 2224/293* (2013.01); *H01L 2224/2929* (2013.01); *H01L 2224/2937* (2013.01); *H01L 2224/29386* (2013.01); *H01L 2224/29387* (2013.01); *H01L 2224/32145* (2013.01); *H01L 2224/32225* (2013.01); *H01L 2224/73204* (2013.01); *H01L 2224/92125* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01); *H01L 2924/01019* (2013.01); *H01L 2924/10253* (2013.01); *H01L 2924/12044* (2013.01); *H01L 2924/15311* (2013.01); *Y10T 428/2991* (2015.01)

(56) References Cited

U.S. PATENT DOCUMENTS

| | | |
|---|---|---|
| 2006/0087020 A1 | 4/2006 | Hirano et al. |
| 2006/0217499 A1 | 9/2006 | Takenaka |
| 2008/0070054 A1 | 3/2008 | Sumita et al. |
| 2008/0274589 A1* | 11/2008 | Lee et al. .......... 438/108 |
| 2008/0280392 A1* | 11/2008 | Stapleton .......... 438/106 |
| 2010/0304536 A1 | 12/2010 | Sumita |
| 2012/0074596 A1* | 3/2012 | Sumita et al. .......... 257/778 |

FOREIGN PATENT DOCUMENTS

| | | |
|---|---|---|
| JP | 2002-305364 A | 10/2002 |
| JP | 2002-359346 A | 12/2002 |
| JP | 2004-327558 A | 4/2003 |
| JP | 2003-318363 | 11/2003 |
| JP | 2004-123796 A | 4/2004 |
| JP | 2004-307650 A | 11/2004 |
| JP | 2006-057015 A | 3/2006 |
| JP | 2006-183020 A | 7/2006 |
| JP | 2007-36184 | 2/2007 |
| JP | 2007-254527 A | 10/2007 |
| JP | 2008-510878 A | 4/2008 |
| JP | 2008-106231 A | 5/2008 |
| JP | 4118691 B2 | 5/2008 |
| JP | 2008-294382 A | 12/2008 |
| JP | 2009-001635 A | 1/2009 |
| JP | 2009-141010 | 6/2009 |
| JP | 2010-010368 A | 1/2010 |
| JP | 2010-34254 | 2/2010 |
| JP | 2011-023607 A | 2/2011 |
| WO | WO 2007/119877 A1 | 10/2007 |

OTHER PUBLICATIONS

Akihiro Horibe, "Inter Chip Fill for 3D Chip Stack" Proceedings of the Japan Institute of Electronics Packaging, the 23$^{rd}$ Annual Meeting, 2009, 3 Pages.

International Search Report issued May 1, 2012 in PCT/JP2012/058676 filed Mar. 30, 2012.

Extended European Search Report issued Sep. 11, 2014 in Patent Application No. 12763795.7.

U.S. Appl. No. 13/865,318, filed Apr. 18, 2013, Ikemoto, et al.

Japanese Office Action drafted Dec. 25, 2015, In corresponding Japanese Patent Application No. 2012-082479, with machine English translation, 6 pp.

Japanese Office Action drafted Feb. 15, 2016, In corresponding Japanese Patent Application No. 2012-082481, with machine English translation, 6 pp.

Japanese Office Action drafted Feb. 15, 2016, In corresponding Japanese Patent Application No. 2012-082482, with machine English translation, 8 pp.

Japanese Office Action drafted Feb. 15, 2016, In corresponding Japanese Patent Application No. 2012-082483, with machine English translation, 5 pp.

First Office Action issued in Chinese patent application No. 201280016243.3, issued Nov. 5, 2015 and English translation of the same, 25 pp.

Second Office Action issued in Chinese patent application No. 201280016243.3, issued Jun. 3, 2016 and English translation of the same, 16 pp.

Taiwanese Office Action issued Aug. 9, 2016 in corresponding Taiwanese Application No. 101111306 and English language translation, 13 pp.

* cited by examiner

THREE-DIMENSIONAL INTEGRATED CIRCUIT LAMINATE, AND INTERLAYER FILLER FOR THREE-DIMENSIONAL INTEGRATED CIRCUIT LAMINATE

TECHNICAL FIELD

The present invention relates to a three-dimensional integrated circuit laminate having semiconductor substrates laminated, and an interlayer filler for a three-dimensional integrated circuit laminate.

BACKGROUND ART

In recent years, for further improvement in the performance of semiconductor devices such as speeding up and an increase in the capacity, research and development is in progress to improve the performance by a three-dimensional (3D) lamination having at least two semiconductor substrates laminated, in addition to refinement of transistors and wiring.

Specifically, such a process is proposed (non-Patent Documents 1 and 2) that a thin film of an interlayer filler composition is formed by an underfilling process of pouring a filler from the side of semiconductor substrates after bonding of the substrates or by application to a wafer, and then B-stage formation is carried out, then semiconductor substrates are cut out by dicing (wafer cutting), temporary bonding by pressure heating is repeatedly carried out by using the semiconductor substrates, and finally main bonding (solder bonding) is carried out under pressure heating conditions to form a three-dimensional integrated circuit laminate.

For practical use of such a three-dimensional integrated circuit device, various problems have been pointed out. One of them is a problem of dissipation of heat generated from a device such as a transistor or wiring. This problem results from a commonly very low thermal conductivity of an interlayer filler composition to be used for lamination of semiconductor substrates as compared with metals and ceramics, and there are concerns about a decrease in the performance such as malfunction of a semiconductor device due to accumulation of heat in a laminate of the semiconductor substrates.

As a further problem, the coefficient of linear thermal expansion required for the interlayer filler composition varies depending upon the difference in the structure of a laminate of the semiconductor substrates. In a three-dimensional integrated circuit laminate comprising a semiconductor substrate laminate having semiconductor substrates bonded and laminated, the interlayer filler layer formed between the semiconductor substrates preferably has low linear thermal expansion property.

As another problem, there is a problem of the dielectric constant of the interlayer filler composition to be used for lamination of a semiconductor device. In recent years, the operating frequency of a semiconductor device increases year by year, and the conduction velocity exceeding the GHz level is required for signal transmission between semiconductor substrates not only inside a semiconductor substrate. On that occasion, if the dielectric constant of an interlayer filler composition to be used for lamination of a semiconductor device is high, signal transmission delays in wiring between substrates will occur, thus leading to a decrease in the operating speed of the entire device.

On the other hand, in a three-dimensional integrated circuit laminate having the semiconductor substrate laminate further bonded to an organic substrate, to an interlayer filler layer formed between the semiconductor substrate laminate and the organic substrate, a potential stress is applied due to a difference in the coefficient of linear thermal expansion by heat between the semiconductor substrates and the organic substrate, and accordingly if the interlayer filler layer does not have an appropriate coefficient of linear thermal expansion, destruction of the semiconductor device layer, breakage of the electric signal connection terminal, or the like may occur in some cases.

As one means to solve the problems, an increase in thermal conductivity of the interlayer filler composition applied to between the substrates of a three-dimensional integrated circuit laminate may be mentioned. For example, a highly thermally conductive epoxy resin is used as a resin itself constituting the interlayer filler composition, or such a resin is combined with a highly thermally conductive inorganic filler, to try to make the interlayer filler composition be highly thermally conductive. For example, a resin composition having high thermal conductivity by an epoxy resin having mesogen (a structure which is likely to be self-aligned) and a curing agent has been reported (Patent Document 1).

Further, in order to control the coefficient of linear thermal expansion of the interlayer filler while suppressing an increase in the dielectric constant, it has been disclosed to blend silica particles as an inorganic filler in a resin (Patent Document 2).

Further, it has been disclosed to blend boron nitride having high thermal conductivity, not a conventional silica filler, as an inorganic filler in a resin (Patent Document 3).

PRIOR ART DOCUMENTS

Patent Documents

Patent Document 1: Japanese Patent No. 4118691
Patent Document 2: JP-A-2004-123796
Patent Document 3: JP-A-2008-510878

Non-Patent Documents

Non-Patent Document 1: Electro Packaging Technologies (CMC Publishing Co., Ltd.), p 102 (2003)
Non-Patent Document 2: Proceedings of the Japan Institute of Electronics Packaging, Annual Meeting (Japan Institute of Electronics Packaging), p 61, p 23 (2009)

DISCLOSURE OF INVENTION

Technical Problem

In the above three-dimensional integrated circuit laminate having semiconductor substrates laminated, for further improvement in the performance such as speeding up of signal transmission and an increase in the capacity, the distance between the semiconductor substrates is estimated to be 50 µm or shorter, and a three-dimensional integrated circuit laminate having such a minute space between the semiconductor substrates filled with an interlayer filler composition having high thermal conductivity and a low coefficient of linear thermal expansion to bond the semiconductor substrates has been desired.

As a conventional technique to fill a space between semiconductor substrates, an underfilling process of bonding a semiconductor substrate and an organic substrate or bonding organic substrates has been proposed. Bonding is carried out after applying a flux (a solder flux) to electric connection terminals, and after the flux is cleaned away, the space is filled with a filler from the side of the substrates by means of capillarity. However, due to a very short distance between the semiconductor substrates, it tends to be difficult to clean the flux away after bonding and to uniformly fill the space with the interlayer filler composition.

Further, as a method of laminating a semiconductor substrate on another substrate, an OBAR (over bump applied resin) method has also been proposed, which comprises bonding of substrates after an interlayer filler composition is applied to the substrate. However, the thermal conductivity of the interlayer filler composition employed for the OBAR method is at the same level as the material for the underfilling process, and it was insufficient as the thermal conductivity between the semiconductor substrates in the three-dimensional integrated circuit laminate.

Further, the maximum particle size of the filler blended in the interlayer filler layer of the three-dimensional integrated circuit laminate is desired to be at most about one-third of the thickness of the interlayer filler layer, so as to realize secure bonding of the semiconductor substrate. However, the spherical boron nitride aggregates disclosed in Patent Document 2 have a high thermal conductivity but have large particle sizes, and accordingly when they are used as a filler to be blended in the interlayer filler composition forming the interlayer filler layer of the three-dimensional integrated circuit laminate, they may inhibit bonding of the semiconductor substrate.

On the other hand, if a filler having small particle sizes is used, it can hardly be uniformly mixed when blended with a resin constituting the interlayer filler composition. In addition, the number of points of contact of thermally conductive paths by the filler in the interlayer filler layer is increased, whereby the possibility of the thermally conductive paths being connected from top to bottom in the thickness direction between the semiconductor substrates tends to be low, and the thermal conductivity in the thickness direction of the interlayer filler layer may be insufficient.

Further, conventional boron nitride has a hexagonal crystal structure in which hexagonal network layers are laminated in a two layer cycle, and the thickness relative to the size of the crystal face tends to be small. Accordingly, addition of a boron nitride filler in a large amount relative to the resin so as to increase the thermal conductivity increases the viscosity, whereby bonding of the substrates will be difficult, and even if the boron nitride filler is added, it has been difficult to achieve predetermined thermal conductivity.

Under these circumstances, it is an object of the present invention to provide a three-dimensional integrated circuit laminate comprising a laminate having at least two silicon substrates each having a semiconductor device layer formed thereon laminated or a laminate having such a laminate further mounted on an organic substrate, filled in with an interlayer filler composition having both high thermal conductivity and low linear thermal expansion property, by laminating semiconductor device substrates by an interlayer filler composition comprising specific resin and inorganic filler in combination.

Solution to Problem

The present inventors have conducted extensive studies and as a result, they have found that the above object can be achieved by the present invention, and accomplished the present invention.

That is, the present invention provides the following.

(1) A three-dimensional integrated circuit laminate, which comprises a semiconductor substrate laminate having at least two semiconductor substrates each having a semiconductor device layer formed thereon laminated, and has a first interlayer filler layer containing a resin (A) and an inorganic filler (B) and having a thermal conductivity of at least 0.8 W/(m·K) between the semiconductor substrates.

(2) The three-dimensional integrated circuit laminate according to the above (1), wherein the coefficient of linear thermal expansion of the first interlayer filler layer is at least 3 ppm/K and at most 70 ppm/K.

(3) The three-dimensional integrated circuit laminate according to the above (1) or (2), wherein the dielectric constant of the inorganic filler (B) contained in the first interlayer filler layer is at most 6.

(4) The three-dimensional integrated circuit laminate according to any one of the above (1) to (3), wherein the inorganic filler (B) contained in the first interlayer filler layer has an average particle size of at least 0.1 μm and at most 10 μm, a maximum particle size of 10 μm, and a thermal conductivity of at least 2 W/(m·K).

(5) A three-dimensional integrated circuit laminate, which comprises a semiconductor substrate laminate having at least two semiconductor substrates each having a semiconductor device layer formed thereon laminated, and has a first interlayer filler layer containing a resin (A) and an inorganic filler (B) and having a coefficient of linear thermal expansion of at least 3 ppm/K and at most 70 ppm/K between the semiconductor substrates, and the inorganic filler (B) having an average particle size of at least 0.1 μm and at most 10 μm and a maximum particle size of 10 μm.

(6) A three-dimensional integrated circuit laminate, which comprises a semiconductor substrate laminate having at least two semiconductor substrates each having a semiconductor device layer formed thereon laminated, and has a first interlayer filler layer containing a resin (A) and an inorganic filler (B) between the semiconductor substrates, and the inorganic filler (B) having an average particle size of at least 0.1 μm and at most 10 μm, a maximum particle size of 10 μm, and a dielectric constant of at most 6.

(7) The three-dimensional integrated circuit laminate according to any one of the above (1) to (6), wherein the first interlayer filler layer contains the inorganic filler (B) in an amount of at least 50 parts by weight and at most 400 parts by weight per 100 parts by weight of the resin (A).

(8) The three-dimensional integrated circuit laminate according to any one of the above (1) to (7), wherein the specific surface area of the inorganic filler (B) contained in the first interlayer filler layer between the semiconductor substrates is at least 1 m²/g and at most 60 m²/g.

(9) The three-dimensional integrated circuit laminate according to any one of the above (1) to (8), wherein the semiconductor substrates are silicon substrates.

(10) The three-dimensional integrated circuit laminate according to any one of the above (1) to (9), wherein of the inorganic filler (B), the average particle size is at least 0.2 μm and at most 5 μm, and the specific surface area is at least 1 m²/g and at most 25 m²/g.

(11) The three-dimensional integrated circuit laminate according to any one of the above (1) to (10), wherein the inorganic filler (B) is boron nitride.

(12) The three-dimensional integrated circuit laminate according to any one of the above (1) to (11), wherein the resin (A) is a resin containing an epoxy resin as the main component.

(13) The three-dimensional integrated circuit laminate according to any one of the above (1) to (12), wherein the thickness of the first interlayer filler layer is at least 1 μm and at most 50 μm.

(14) The three-dimensional integrated circuit laminate according to any one of the above (1) to (13), which has solder connection terminals for electric signal connection between the semiconductor substrates each having a semiconductor device layer formed thereon in the first interlayer filler layer.

(15) The three-dimensional integrated circuit laminate according to any one of the above (1) to (14), wherein the semiconductor substrate laminate is further mounted on an organic substrate, and a second interlayer filler layer containing a resin (a) and an inorganic filler (b) is formed between the semiconductor substrate laminate and the organic substrate.

(16) The three-dimensional integrated circuit laminate according to the above (15), wherein the organic substrate has a multilayer circuit structure having a wiring layer containing copper in a resin plate containing an epoxy resin as a resin component.

(17) The three-dimensional integrated circuit laminate according to the above (15) or (16), wherein the second interlayer filler layer contains the inorganic filler (b) in an amount of at least 50 parts by weight and at most 400 parts by weight per 100 parts by weight of the resin (a).

(18) The three-dimensional integrated circuit laminate according to any one of the above (15) to (17), wherein the coefficient of linear thermal expansion of the second interlayer filler layer is at least 10 ppm/K and at most 50 ppm/K.

(19) The three-dimensional integrated circuit laminate according to any one of the above (15) to (18), wherein the dielectric constant of the second interlayer filler layer is at most 6.

(20) The three-dimensional integrated circuit laminate according to any one of the above (15) to (19), wherein the resin (a) is a resin containing an epoxy resin as the main component.

(21) The three-dimensional integrated circuit laminate according to any one of the above (15) to (20), wherein the inorganic filler (b) has an average particle size of at least 0.1 μm and at most 20 μm, a maximum particle size of 30 μm, a specific surface area of at least 1 $m^2/g$ and at most 60 $m^2/g$, a thermal conductivity of at least 1 W/(m K), and a dielectric constant of at most 6.

(22) An interlayer filler for a first interlayer filler layer between semiconductor substrates of a three-dimensional integrated circuit laminate comprising a semiconductor substrate laminate having at least two semiconductor substrates each having a semiconductor device layer formed thereon laminated, which comprises a resin (A) and an inorganic filler (B) having an average particle size of at least 0.1 μm and at most 5 μm, a maximum particle size of 10 μm and a dielectric constant of at most 6, and has a coefficient of linear thermal expansion of at least 3 ppm/K and at most 70 ppm/K.

(23) An interlayer filler for a second interlayer filler layer between a semiconductor substrate laminate and an organic substrate of a three-dimensional integrated circuit laminate comprising the semiconductor substrate laminate having at least two semiconductor substrates each having a semiconductor device layer formed thereon laminated, which comprises a resin (a) and an inorganic filler (b) having an average particle size of at least 0.1 μm and at most 20 μm, a maximum particle size of 30 μm and a dielectric constant of at most 6, and has a coefficient of linear thermal expansion of at least 10 ppm/K and at most 50 ppm/K.

(24) The interlayer filler according to the above (22) or (23), wherein the specific surface area of the inorganic filler (B) or (b) is at least 1 $m^2/g$ and at most 60 $m^2/g$.

Advantageous Effects of Invention

According to the present invention, by laminating semiconductor substrates each having a semiconductor device layer formed thereon by an interlayer filler layer having high thermal conductivity, a low dielectric constant and a low linear thermal expansion property, it is possible to form a three-dimensional integrated circuit laminate having excellent reliability in which thermal conductivity between the semiconductor substrates is accelerated and the temperature of the semiconductor device substrates is lowered, thereby to achieve a high dissipation property and high speed operation, and a semiconductor device can stably be operated.

DESCRIPTION OF EMBODIMENTS

Now, the present invention will be described. However, the present invention is not limited to the following description, and various modifications are possible within a range of the scope of the invention.

(1) First Three-Dimensional Integrated Circuit Laminate

The three-dimensional integrated circuit laminate of the present invention comprises a semiconductor substrate laminate having at least two semiconductor substrates each having a semiconductor device layer formed thereon laminated, and has a first interlayer filler layer containing a resin (A) and an organic filler (B) and having a thermal conductivity of at least 0.8 W/(m·K) between the semiconductor substrates.

Figure 1:
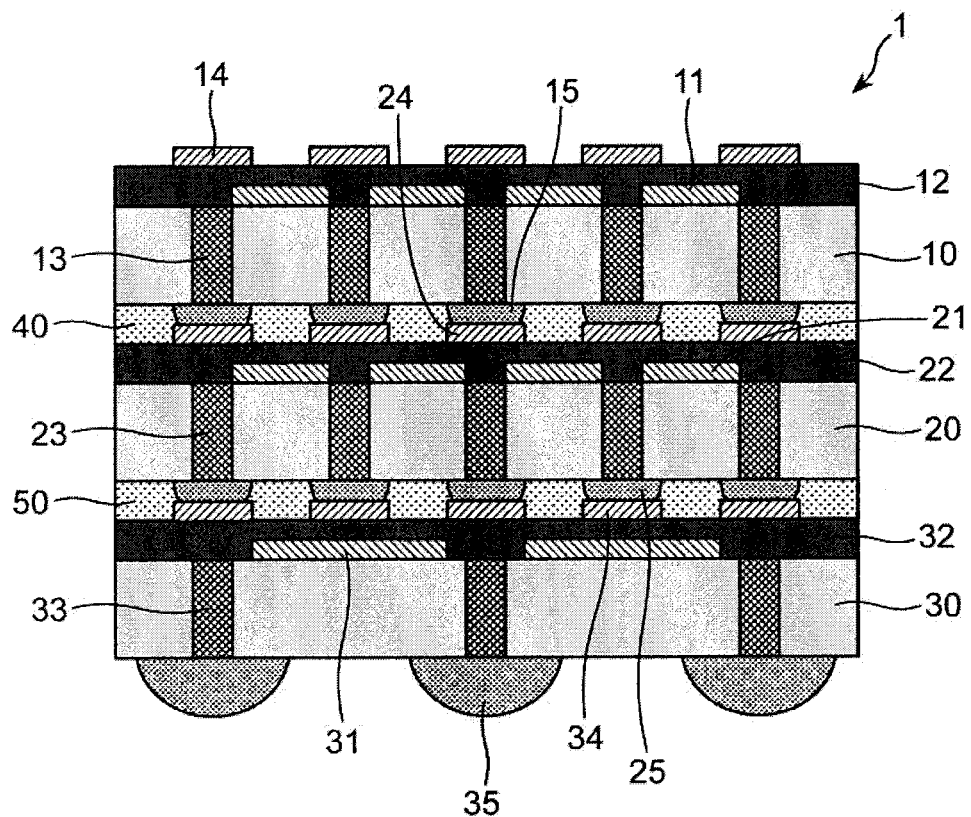
FIG. 1 is a cross-sectional view conceptually illustrating a three-dimensional integrated circuit laminate according to a first embodiment of the present invention (first three-dimensional integrated circuit laminate).

In FIG. 1, a cross-sectional view conceptually illustrating a three-dimensional integrated circuit laminate according to a first embodiment of the present invention (hereinafter referred to as a first three-dimensional integrated circuit laminate) is shown. In FIG. 1, for easy understanding of the structure of the three-dimensional integrated circuit laminate, the thickness and the size of constituents relative to semiconductor substrates are indicated larger than the actual sizes.

As shown in FIG. 1, a first three-dimensional integrated circuit laminate 1 comprises a semiconductor substrate laminate having three (three-layer is only an example, and the number of layers is not limited so long as it is two or more) semiconductor substrates 10, 20 and 30 respectively having semiconductor device layers 11, 21 and 31 formed thereon laminated.

The first three-dimensional integrated circuit laminate 1 has first interlayer filler layers 40 and 50 each containing a resin (A) and an inorganic filler (B) respectively between the semiconductor substrates 10 and 20 and between the semiconductor substrates 20 and 30.

Figure 2:
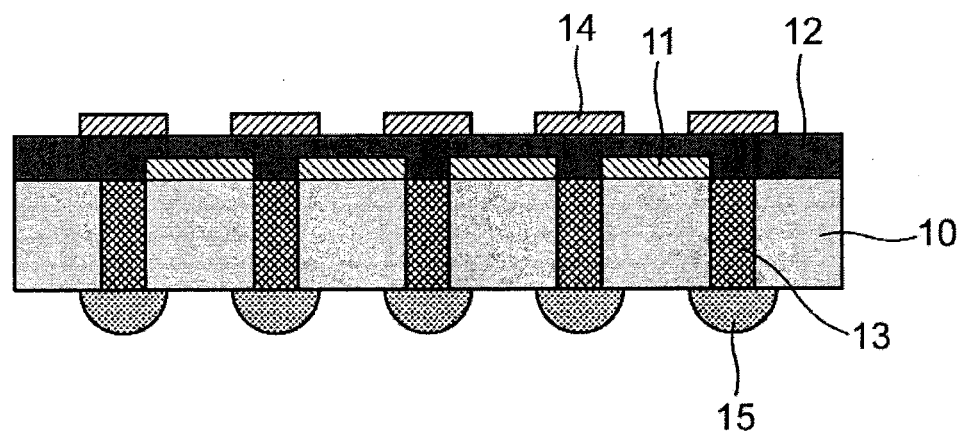
FIG. 2 is a view schematically illustrating the cross-sectional structure of a semiconductor substrate.

In FIG. 2, a view schematically illustrating the cross-sectional structure of the semiconductor substrate 10 is shown. On the semiconductor substrate 10, a semiconductor device layer 11 containing a minute electronic circuit is formed. On the surface of the semiconductor device layer 11, a buffer coat film 12 comprising a polyimide resin or the like is formed so as to protect it from the outside. Further, on the semiconductor substrate 10, semiconductor substrate through-hole electrodes 13 provided to run through the substrate, land electrodes 14 and solder bumps 15 are provided so as to secure electric connection with a semiconductor device layer 21 on the semiconductor substrate 20 adjacent to the semiconductor substrate 10 having the same structure as the semiconductor substrate 10, in the three-dimensional integrated circuit laminate 1.

Further, on the semiconductor substrates 10, 20 and 30, semiconductor substrate through-hole electrodes 13, 23 and 33 provided to run through the substrates, land electrodes 24, 34 and solder bumps 15, 25 and 35 are provided so as to secure electric connection between semiconductor devices on adjacent semiconductor substrates (10 and 20, and 20 and 30), in the first three-dimensional integrated circuit laminate 1.

The land electrodes 24 and the solder bumps 15, and the land electrodes 34 and the solder bumps 25, are respectively present as included in the first interlayer filler layers 40 and 50, and have a function to connect electric signals between the semiconductor substrates 10 and 20, and 20 and 30.

Here, the lands electrodes 24 and the solder connection terminals comprising the solder bumps 15 for electric signal connection between the semiconductor substrates each having the semiconductor device layer 11 formed thereon are included in the first interlayer filler layers 40 and 50, however, their structure is not limited thereto so long as electric connection between semiconductor device layers on the respective semiconductor substrates can be secured.

Now, the first three-dimensional integrated circuit laminate comprising the semiconductor substrate laminate of the present invention will be described in detail.

(1-1) Semiconductor Substrate

As the semiconductor substrate in the first three-dimensional integrated circuit laminate, any one made of an optional material which can be used as a substrate in production of an integrated circuit may be used, and a silicon substrate is preferably used. The silicon substrate may be used with a substrate film thickness depending upon the aperture, or may be used after film thickness reduction to at most 100 μm by back-side polishing such as back side etching or back grinding.

As the solder bumps, minute solder balls may be used, or openings are formed by lithography, solder plating is applied directly to the base of the openings or to posts formed of nickel or copper, and a resist material is removed, followed by heat treatment to form solder bumps. The composition of the solder is not particularly limited, however, a solder containing copper as the principal component is preferably used considering the electric bonding property and the low temperature bonding property.

The land terminals may be formed by forming a thin film on the semiconductor substrate e.g. by PVD (physical vapor deposition), forming a resist film by lithography, and removing unnecessary portions by dry or wet etching. The material of the land electrodes is not particularly limited so long as they can be bonded to the solder bumps, but gold or copper may preferably be used considering the bonding property to the solder, the reliability, etc.

(1-2) First Interlayer Filler Layer

The first interlayer filler layer is formed between the semiconductor substrates and contains a resin (A) and an inorganic filler (B).

The dielectric constant of the first interlayer filler layer is preferably at most 5, more preferably at most 4. If the dielectric constant of the first interlayer filler layer exceeds 5, signal transmission delays in wiring between the substrates will occur, thus leading to a decrease in the operating speed of the entire device, such being unfavorable. Accordingly, the dielectric constant of the inorganic filler (B) contained in the first interlayer filler layer is preferably at most 6. A first interlayer filler layer containing the inorganic filler (B) having a dielectric constant of at most 6 with an appropriate addition amount can achieve a low dielectric property to satisfy the performance as a semiconductor substrate laminate.

The thermal conductivity of the first interlayer filler layer is essentially at least 0.8 W/(m·K), more preferably at least 1.0 W/(m·K). The thermal conductivity is preferably higher, but is usually at most 10 W/(m·K).

If the thermal conductivity of the first interlayer filler layer is less than 0.8 W/(m·K), thermal conductivity between the semiconductor substrates is not sufficient, and the temperature of the semiconductor substrate will be high due to accumulation of heat, and such may cause operation failure, such being unfavorable. Accordingly, the thermal conductivity of the inorganic filler (B) contained in the first interlayer filler layer is preferably at least 2 W/(m·K).

When the thermal conductivity of the inorganic filler (B) is at least 2 W/(m·K), the thermal conductivity will be higher by about 5 times as compared with the resin (A), and the thermal conductivity of the interlayer filler layer can sufficiently be improved with an appropriate addition amount.

If at least one of the average particle size, the specific surface area and the thermal conductivity of the inorganic filler (B) does not satisfy the conditions, the first interlayer filler layer cannot have a sufficient thermal conductivity.

Of the first interlayer filler layer, the coefficient of linear thermal expansion is preferably at least 3 ppm/K and at most 70 ppm/K, more preferably at least 10 ppm/K and at most 60 ppm/K.

When the coefficient of linear thermal expansion of the first interlayer filler layer is within the above range, a potential stress due to the coefficient of expansion of the semiconductor substrate by a change in the temperature at the time of operating the semiconductor can be reduced, and stable operation will be possible without destruction of the semiconductor device layers, breakage of the electric signal connection terminals, or the like.

Since a potential stress will occur in the interlayer filler layer due to a difference in the coefficient of expansion by heat between the semiconductor substrates and the organic substrate, if the interlayer filler layer does not have an appropriate coefficient of linear thermal expansion, destruction of the semiconductor device layer, breakage of electric signal connection terminals, or the like may occur in some cases.

Further, the thickness of the first interlayer filler layer is preferably at least 1 μm and at most 50 μm, more preferably at least 3 μm and at most 45 μm, further preferably at least 5 μm and at most 40 μm. If the thickness is increased, the distance in wiring as the semiconductor will be long, and the signal wiring delays may cause, and accordingly the merit in formation of substrates into a three-dimensional lamination tends to be small, such being unfavorable. If the thickness is small, the distance in wiring tends to be short, and the signal wiring delays can be reduced, however, processing will be very difficult, including the film thickness uniformity of the interlayer filler layer. By the thickness within the above range, both processability and performance can be achieved.

Now, the respective components in the composition constituting the first interlayer filler layer (hereinafter sometimes referred to as a first interlayer filler composition) will be described in detail.

The first interlayer filler composition comprises a resin (A) and an inorganic filler (B) and as the case requires, contains a curing agent (C), a flux (D) or the like.

[Resin (A)]

The resin (A) has, in order to obtain sufficient thermal conductivity when combined with an inorganic filler (B) in the first interlayer filler composition, a thermal conductivity of preferably at least 0.2 W/(m·K), more preferably at least 0.22 W/(m·K). The thermal conductivity is preferably higher, but is usually at most 1.0 W/(m·K).

Further, to carry out positioning to a substrate to be bonded before temporary bonding after formation of a thin film on the substrate, the resin (A) has a melt viscosity at 50° C. of preferably at least 2,000 Pa·s, more preferably at least 10,000 Pa·s.

Further, when main bonding is carried out after temporary bonding, in order to melt the first interlayer filler composition by heating to connect electric connection terminals, the resin (A) has a melt viscosity at 120° C. of preferably at most 100 Pa·s, more preferably at most 20 Pa·s.

The resin (A) may, for example, be specifically an epoxy resin, a phenol resin, a urea resin, a melamine resin, a benzoguanamine resin, a polyester resin, an allyl resin, an alkyd resin, a urethane resin, a silicon resin, an acrylic resin or a polyimide resin. Among these resins, preferred is a thermosetting resin excellent in the heat resistance and various electric properties. Among thermosetting resins, preferred is a resin containing an epoxy resin as the main component in view of the processability before curing, the B-stage film property and other curing properties, physical properties of a cured film, etc., and more preferred is a resin consisting solely of an epoxy resin.

Here, "containing an epoxy resin as the main component" means that the proportion of the epoxy resin in the resin (A) is at least 50 wt %, preferably at least 60 wt % (including 100 wt %).

Now, as an example of a preferred resin as the resin (A), a case of using an epoxy resin will be described.

As the epoxy resin, any epoxy resin may be used. As the epoxy resin, an epoxy resin having a single type of structural units may be used alone, or a plurality of epoxy resins differing in the structural units may be used in combination.

The epoxy resin preferably contains at least the aftermentioned phenoxy resin (hereinafter referred to as epoxy resin (A1)), in order to reduce voids at the time of bonding to obtain a highly thermally conductive cured product, in addition to have coating properties or film formation properties and bonding properties, and particularly, it preferably contains the epoxy resin (A1) in a weight ratio based on the total amount of the epoxy resins of preferably from 5 to 95 wt %, more preferably from 10 to 90 wt %, further preferably from 20 to 80 wt %.

[Epoxy Resin (A1)]

A phenoxy resin usually means a resin obtainable by reacting an epihalohydrine with a dihydric phenol compound, or a resin obtainable by reacting a bivalent epoxy compound with a dihydric phenol compound, and in the present invention, among such resins, particularly a phenoxy resin which is an epoxy resin having a weight average molecular weight of at least 200 and at most 100,000 will be referred to as an epoxy resin (A1). The upper limit of the weight average molecular weight of the epoxy resin (A1) is preferably at most 50,000, more preferably at most 30,000.

The epoxy resin (A1) is preferably a phenoxy resin having at least one skeleton selected from the group consisting of a naphthalene skeleton, a fluorene skeleton, a biphenyl skeleton, an anthracene skeleton, a pyrene skeleton, a xanthene skeleton, an adamantane skeleton and a dicyclopentadiene skeleton. Among them, a phenoxy resin having a fluorene skeleton and/or a biphenyl skeleton is particularly preferred, whereby the heat resistance is more increased.

As described above, as the epoxy resin, a plurality of epoxy resins differing in the structural units may be used.

The epoxy resin other than the above epoxy resin (A1) is preferably an epoxy resin having at least two epoxy groups in its molecule (hereinafter sometimes referred to as epoxy resin (A2)). For example, various epoxy resins such as a bisphenol A type epoxy resin, a bisphenol F type epoxy resin, a naphthalene type epoxy resin, a phenol novolac type epoxy resin, a cresol novolac type epoxy resin, a phenol aralkyl type epoxy resin, a biphenyl type epoxy resin, a triphenylmethane type epoxy resin, a dicyclopentadiene type epoxy resin, a glycidyl ester type epoxy resin, a glycidyl amine type epoxy resin and a polyfunctional phenol type epoxy resin may be mentioned.

They may be used alone or as a mixture of two or more.

With a view to controlling the melt viscosity, the weight average molecular weight of the epoxy resin (A2) is preferably from 100 to 5,000, more preferably from 200 to 4,000. One having a weight average molecular weight lower than 100 tends to be inferior in the heat resistance, and if the weight average molecular weight is higher than 5,000, the melting point of the epoxy resin tends to be high, thus lowering the bonding properties.

Further, within a range not to impair the object of the present invention, a resin other than the epoxy resin (A1) and the epoxy resin (A2) (hereinafter sometimes referred to as other resin) may be contained in the resin (A).

In the resin (A), the proportion of the epoxy resin (A1) in all the epoxy resins including the epoxy resin (A1) and the epoxy resin (A2) is preferably from 3 to 95%, more preferably from 10 to 90 wt %, further preferably from 20 to 80 wt % per 100 wt % of the total amount. Here, "all the resins including the epoxy resin (A1) and the epoxy resin (A2)" means the epoxy resin (A1) and the epoxy resin (A2) in total in a case where the resin (A) consists only of the epoxy resin (A1) and the epoxy resin (A2), and means the epoxy resin (A1), the epoxy resin (A2) and other resin in total in a case where the resin (A) further contains other resin.

By the proportion of the epoxy resin (A1) being at least 10 wt %, a sufficient effect of improving the thermal conductivity by blending the epoxy resin (A1) can be obtained, and desired high thermal conductivity can be obtained. By the proportion of the epoxy resin (A1) being less than 90 wt % and the proportion of the epoxy resin (A2) being at least 10 wt %, the effect by blending the epoxy resin (A2) will be obtained, and sufficient curing properties and physical properties of a cured product will be obtained.

[Inorganic Filler (B)]

By the first interlayer filler layer containing an inorganic filler (B) having a high thermal conductivity, high thermal conductivity can be imparted to the first interlayer filler layer, whereby thermal conduction between the semiconductor substrates can be accelerated and the temperature of the semiconductor device substrate can be lowered, and accordingly the semiconductor device can be operated stably.

The inorganic filler (B) is preferably one having high thermal conductivity, and the thermal conductivity is particularly preferably at least 2 W/(m·K), more preferably at least 3 W/(m·K). The thermal conductivity is preferably higher, but is usually at most 300 W/(m·K).

The dielectric constant of the inorganic filler (B) is preferably at most 6, more preferably at most 5. If the dielectric constant exceeds 6, the signal transmission delays in wiring between the substrates may occur, thus leading to a decrease in the operating speed of the entire device, such being unfavorable. The dielectric constant is preferably lower, but is usually at least 3.

When the dielectric constant is at most 6, preferably at most 5, the signal transmission delays can be reduced, and the operation speed of the semiconductor device can be improved.

The dielectric constant of the inorganic filler (B) can be measured by an optional method, and is commonly obtained by sandwiching a sample between metal electrodes and measuring the capacity and the dielectric dissipation factor.

To measure the dielectric constant, an optional frequency may be employed, and it is preferred to employ a frequency of 10 MHz in view of the measurement accuracy. Further, along with speeding up of the operating frequency of a semiconductor, it is more preferred to employ a frequency of from 100 MHz to 10 GHz to measure the dielectric constant.

The inorganic filler (B) may, for example, be alumina ($Al_2O_3$, thermal conductivity: W/(m·K)), aluminum nitride (AlN, thermal conductivity: 260 W/(m·K)), boron nitride (BN, thermal conductivity: 3 W/(m·K) (thickness direction), 275 W/(m·K) (in-plane direction), silicon nitride ($Si_3N_4$, thermal conductivity: 23 W/(m·K)) or silica ($SiO_2$, thermal conductivity: 1.4 W/(m·K)).

The inorganic filler (B) preferably further has stability against oxygen, water and exposure to high temperature, and a low dielectric property, in view of the reliability of a device formed by lamination. Such an inorganic filler (B) is preferably $Al_2O_3$, AlN, BN or $SiO_2$, especially preferably BN. Such inorganic fillers (B) may be used alone or as a mixture of at least two in optional combination and proportion.

If the inorganic material used as the inorganic filler (B) is a commercially available product or may be immediately after preparation, the powder aggregates in some cases. Accordingly, the inorganic material used as the inorganic filler (B) is preferably ground to an appropriate particle size.

The method of grinding the inorganic material is not particularly limited, and a method of stirring and mixing it with grinding media such as zirconia beads, or a known grinding method such as jet spraying may be employed.

The inorganic filler (B) preferably has an average particle size of at least 0.1 μm and at most 10 μm and a specific surface area of at least 1 $m^2$/g and at most 60 $m^2$/g, more preferably has an average particle size of at least 0.2 μm and at most 5 μm and a specific surface area of at least 1 $m^2$/g and at most 25 $m^2$/g, particularly preferably has an average particle size of at least 0.2 μm and at most 3 μm and a specific surface area of at least 1 $m^2$/g and at most 15 $m^2$/g.

The average particle size of the inorganic filler (B) is a value measured after grinding, and the specific surface area is a value measured before grinding. Specific methods for measuring the average particle size and the specific surface area of the inorganic filler (B) are described in Examples.

Further, the maximum particle size of the inorganic filler (B) is preferably 20 μm (that is, all the particles of the inorganic filler (B) are 20 μm or smaller), more preferably 10 μm.

The inorganic filler (B) may be properly subjected to surface treatment to increase the dispersability in the resin (A) or in the coating fluid. Further, an inorganic filler subjected to heat treatment may be used so as to increase the crystallinity or to remove moisture.

In the highly integrated three-dimensional integrated circuit laminate, the thickness of the first interlayer filler layer is so small as at most 50 μm. Accordingly, if the average particle size of the inorganic filler to be blended exceeds 10 μm, the inorganic filler is likely to protrude on the surface, whereby the surface state of the first interlayer filler layer tends to be deteriorated, the bonding properties of the interlayer filler composition will be lowered, and the semiconductor substrates cannot sufficiently be bonded.

On the other hand, if the particle size of the inorganic filler (B) is too small, the number of necessary thermally conductive paths is increased, whereby the possibility of the thermally conductive paths being connected from top to bottom in the thickness direction between the semiconductor substrates tends to be low, and the thermal conductivity in the thickness direction of the interlayer filler layer may be insufficient even if combined with the epoxy resin (A) having high thermal conductivity. Further, if the particle size of the inorganic filler (B) is too small, the inorganic filler (B) is likely to aggregate, thus deteriorating the dispersability in the interlayer filler composition.

Further, if the specific surface area is less than 1 $m^2$/g, the particle size of the inorganic filler (B) tends to be large, whereby bonding will be difficult, and if it exceeds 60 $m^2$/g, the particle size of the inorganic filler (B) tends to be too small, and the above problem of aggregation may arise, or the shape of the inorganic filler (B) will significantly depart from a spherical shape, and accordingly the viscosity of the interlayer filler composition will be increased, and the amount of the filler in the interlayer filler layer cannot be increased, and predetermined thermal conductivity cannot be achieved.

By the average particle size and the specific surface area of the inorganic filler (B) being within the above ranges, excessive aggregation of the inorganic filler particles can be suppressed, and a sufficient amount of the inorganic filler can be contained, whereby an interlayer filler layer having a sufficient thermal conductivity in the thickness direction can be obtained.

Further, as the inorganic filler (B), at least two types of inorganic fillers differing in the average particle size may be used. For example, by using an inorganic filler having a relatively small average particle size of, for example, from 0.1 to 3 μm, preferably from 0.2 to 1.5 μm, and an inorganic filler having a relatively large average particle size of, for example, from 1 to 10 μm, preferably from 1 to 5 μm, in combination, the thermally conductive paths of the inorganic filler particles having a large average particle size are connected by the inorganic filler having a small average particle size, whereby high filling becomes possible as compared with a case of using only one having a single average particle size, and higher thermal conductivity can be obtained.

In such a case, it is preferred to use an inorganic filler having a small average particle size and an inorganic filler having a large average particle size in a weight ratio of from 10:1 to 1:10, in view of formation of thermally conductive paths.

The first interlayer filler composition may contain a filler other than the inorganic filler (B) (hereinafter referred to as other filler) for the purpose of adjusting the viscosity or for another purpose, within a range not to impair the effects of the present invention.

For example, in a case where the filler is added for the purpose of adjusting the viscosity, not for the purpose of improving the thermal conductivity, silica ($SiO_2$, thermal conductivity: 1.4 W/(m·K)) which is a general purpose filler, the thermal conductivity of which is not so high, may be used.

The average particle size and the maximum particle size of such other filler are preferably within the same range as the inorganic filler (B).

The content of the inorganic filler (A) in the first interlayer filler layer is preferably at least 50 parts by weight and at most 400 parts by weight, more preferably at least 75 parts by weight and at most 300 parts by weight, per 100 parts by weight of the resin (A). If the content of the inorganic filler (B) is less than 50 parts by weight, no sufficient thermal conductivity will be obtained in some cases, and if it exceeds 400 parts by weight, the viscosity of the composition tends to be high, whereby a problem such that no uniform coating film can be formed may arise.

[Curing Agent (C)]

The first interlayer filler composition may contain a curing agent (C). The curing agent (C) used in the present invention is, in a case where an epoxy resin is used, a substance which contributes to the crosslinking reaction between epoxy groups of the epoxy resin.

The curing agent (C) is not particularly limited, and all the known epoxy resin curing agents may be used. It may, for example, be a phenol type curing agent, an amine type curing agent such as an aliphatic amine, a polyether amine, an alicyclic amine or an aromatic amine, an acid anhydride type curing agent, an amide type curing agent, a tertiary amine, imidazole or a derivative thereof, an organic phosphine, a phosphonium salt, a tetraphenylborate salt, an organic acid dihydrazide, a boron halide amine complex, a polymercaptan type curing agent, an isocyanate type curing agent or a blocked isocyanate type curing agent.

The phenol type curing agent may, for example, be specifically bisphenol A, bisphenol F, 4,4'-dihydroxy diphenyl methane, 4,4'-dihydroxy diphenyl ether, 1,4-bis(4-hydroxyphenoxy)benzene, 1,3-bis(4-hydroxyphenoxy)benzene, 4,4'-dihydroxy diphenyl sulfide, 4,4'-dihydroxy diphenyl ketone, 4,4'-dihydroxy diphenyl sulfone, 4,4'-dihydroxybiphenyl, 2,2'-dihydroxybiphenyl, 10-(2,5-dihydroxyphenyl)-10H-9-oxa-10-phosphaphenanthrene-10-oxide, phenol novolak, bisphenol A novolak, o-cresol novolak, m-cresol novolak, p-cresol novolak, xylenol novolak, poly-p-hydroxystyrene, hydroquinone, resorcin, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated product or polyallylated product of the above dihydroxynaphthalene, allylated bisphenol A, allylated bisphenol F, allylated phenol novolak or allylated pyrogallol.

As the amine type curing agent, the aliphatic amine may, for example, be specifically ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine or tetra(hydroxyethyl)ethylenediamine.

The polyether amine may, for example, be specifically triethylene glycol diamine, tetraethylene glycol diamine, diethylene glycol bis(propylamine), polyoxypropylene diamine or polyoxypropylene triamine.

The alicyclic amine may, for example, be specifically isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane or norbornenediamine.

The aromatic amine may, for example, be specifically tetrachloro-p-xylene diamine, m-xylene diamine, p-xylene diamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane or α,α'-bis(4-aminophenyl)-p-diisopropylbenzene.

The acid anhydride type curing agent may, for example, be specifically dodecenyl succinic anhydride, polyadipic anhydride, polyazelaic anhydride, polysebacic anhydride, poly(ethyloctadecanedioic) anhydride, poly(phenylhexadecanedioic) anhydride, methyltetrahydrophthalic anhydride, methylhexahydrophthalic anhydride, hexahydrophthalic anhydride, methylhimic anhydride, tetrahydrophthalic anhydride, trialkyltetrahydrophthalic anhydride, methylcyclohexane dicarboxylic anhydride, methylcyclohexanetetracarboxylic anhydride, phthalic anhydride, trimellitic anhydride, pyromellitic anhydride, benzophenonetetracarboxylic anhydride, ethylene glycol bistrimellitate dianhydride, HET anhydride, Nadic anhydride, methyl Nadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, or 1-methyl-dicarboxy-1,2,3,4-tetrahydro-1-naphthalene succinic dianhydride.

The amide type curing agent may, for example, be dicyandiamide or a polyamide resin.

The tertiary amine may, for example, be 1,8-diazabicyclo(5,4,0)undecene-7, triethylenediamine, benzyldimethylamine, triethanolamine, dimethylaminoethanol or tris(dimethylaminomethyl)phenol.

The imidazole or its derivative may, for example, be 1-cyanoethyl-2-phenylimidazole, 2-phenylimidazole, 2-ethyl-4(5)-methylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1)]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole or an adduct of an epoxy resin with the above imidazole.

The organic phosphine may, for example, be tributylphosphine, methyldiphenylphosphine, triphenylphosphine, diphenylphosphine or phenylphosphine.

The phosphonium salt may, for example, be tetraphenylphosphonium tetraphenylborate, tetraphenylphosphonium ethyltriphenylborate or tetrabutylphosphonium tetrabutylborate.

The tetraphenylborate salt may, for example, be 2-ethyl-4-methylimidazole tetraphenylborate or N-methylmorpholine tetraphenylborate.

The above curing agents may be used alone or as a mixture of at least two in optional combination and proportion.

Among the above curing agents, the imidazole or its derivative, or the amide type curing agent is suitably used.

In a case where as the after-mentioned flux (D), an organic carboxylic acid or an organic carboxylate having a function to cure the epoxy resin is used, such an organic carboxylic acid or carboxylate may be used as the curing agent (C).

The content of the curing agent (C) in the first interlayer filler composition is usually preferably from 0.1 to 60 parts by weight, more preferably from 0.5 to 10 parts by weight per 100 parts by weight of the resin (A) containing the epoxy resin as the main component.

Here, in a case where the curing agent is a phenol type curing agent, an amine type curing agent or an acid anhydride type curing agent, it is preferably used so that the equivalent ratio of the functional groups in the curing agent and the epoxy groups in the epoxy resin is within a range of from 0.8 to 1.5, more preferably from 0.9 to 1.2. If it is out of this range, unreacted epoxy groups or functional groups in the curing agent may remain, whereby no desired physical properties may be obtained.

Further, in a case where the curing agent is an amide type curing agent, a tertiary amine, an imidazole or its derivative, an organic phosphine, a phosphonium salt, a tetraphenylborate salt, an organic acid dihydrazide, a boron halide amine complex, a polymercaptan type curing agent, an isocyanate type curing agent, a blocked isocyanate type curing agent or the like, it is preferably used in an amount of from 0.1 to 20 parts by weight, more preferably from 0.5 to 10 parts by weight per 100 parts by weight of the epoxy resin in the epoxy resin composition.

[Flux (D)]

The flux (D) is specifically a compound which has functions to dissolve and remove the surface oxide film on metal electric signal terminals such as solder bumps and lands, to improve the wettability on the land surface of the solder bumps and further, to prevent re-oxidation on the metal terminal surface of the solder bumps, at the time of solder bonding of the metal terminals. The flux (D) is contained in the first interlayer filler composition in a case where solder connection terminals for electric signal connection between the semiconductor substrates each having a semiconductor device layer formed thereon are included in the first interlayer filler layer.

The flux (D) may, for example, be an aliphatic carboxylic acid such as oxalic acid, malonic acid, succinic acid, glutaric acid, adipic acid, malic acid, tartaric acid, citric acid, lactic acid, acetic acid, propionic acid, butyric acid, oleic acid or stearic acid; an aromatic carboxylic acid such as benzoic acid, salicylic acid, phthalic acid, trimellitic acid, trimellitic anhydride, trimesic acid or benzenetetracarboxylic acid; a terpene carboxylic acid such as abietic acid or rosin; an organic carboxylate which is a hemiacetal ester having an organic carboxylic acid converted by reaction with an alkyl vinyl ether; an organic halogen compound such as glutamic acid hydrochloride, aniline hydrochloride, hydrazine hydrochloride, cetyl pyridine bromide, phenylhydrazine hydrochloride, tetrachloronaphthalene, methylhydrazine hydrochloride, methylamine hydrochloride, ethylamine hydrochloride, diethylamine hydrochloride or butylamine hydrochloride; an amine such as urea or diethylene triamine hydrazine; a polyhydric alcohol such as ethylene glycol, diethylene glycol, triethylene glycol, tetraethylene glycol, hexaethylene glycol, glycerin, trimethylolethane, trimethylolpropane, 2,3,4-trihydroxybenzophenone, triethanolamine, erythritol, pentaerythritol, bis(2-hydroxymethyl)iminotris-(hydroxymethyl)methane or ribitol; an inorganic acid such as hydrochloric acid, hydrofluoric acid, phosphoric acid or fluoroboric acid; a fluoride such as potassium fluoride, sodium fluoride, ammonium fluoride, copper fluoride, nickel fluoride or zinc fluoride, a chloride such as potassium chloride, sodium chloride, cuprous chloride, nickel chloride, ammonium chloride, zinc chloride or stannous chloride; or a bromide such as potassium bromide, sodium bromide, ammonium bromide, tin bromide or zinc bromide. These compounds may be used as they are or may be used in the form of microcapsules using a covering agent of e.g. an organic polymer or an inorganic compound. These compounds may be used alone or as a mixture of at least two in optional combination and proportion.

Among them, in view of the solubility in the resin (A) or various solvents, preferred is a polyhydric alcohol, an organic carboxylic acid or a carboxylate.

The melt temperature of the flux (D) is preferably from 90° C. to 220° C., more preferably from 100° C. to 200° C., further preferably from 120° C. to 180° C., in order to fulfill functions to dissolve the oxide film on the solder surface before solder bonding, to improve the wettability on the solder surface, and to prevent re-oxidation of the solder surface.

Further, in a case where the flux (D) is a polyhydric alcohol, an organic carboxylic acid or a carboxylate, preferred is one which is less likely to be decomposed, or volatilized or evaporated, at a temperature of from 220 to 260° C. at the time of solder bonding. In such a case, the decomposition temperature and the boiling point are preferably at least 250° C., more preferably at least 270° C., most preferably at least 290° C.

The polyhydric alcohol is preferably trimethylolpropane, erythritol, pentaerythritol or ribitol.

The organic carboxylic acid is preferably glutaric acid, adipic acid or trimellitic acid.

The temperature at which the organic carboxylate is thermally decomposed to form a carboxylic acid thereby to fulfill the functions, is preferably at least 130° C., more preferably at least 140° C., further preferably at least 160° C., most preferably at least 180° C. The temperature is preferably higher, but is usually preferably at most 200° C.

As the organic carboxylic acid as the material of the organic carboxylate, a monocarboxylic acid such as lactic acid, acetic acid, propionic acid, butyric acid, oleic acid, stearic acid, benzoic acid, abietic acid or rosin; a dicarboxylic acid such as oxalic acid, malonic acid, succinic acid, glutaric acid, adipic acid, malic acid, tartaric acid, isophthalic acid, pyromellitic acid, maleic acid, fumaric acid or itaconic acid; a tricarboxylic acid such as citric acid, 1,2,4-trimellitic acid or tris(2-carboxyethyl)isocyanurate; or a tetracarboxylic acid such as pyromellitic acid or butane tetracarboxylic acid may, for example, be used. Among them, in view of the reactivity as the flux, preferred is a polycarboxylic acid having at least two carboxy groups.

Further, as the alkyl vinyl ether as the material of the organic carboxylate, preferred is one having a $C_{1-6}$ alkyl group, particularly preferably one wherein the alkyl group is a methyl group, an ethyl group, a propyl group or a butyl group. Among these alkyl groups, preferred is a secondary or primary alkyl group, since the lower the electron-donating properties of an alkyl group, the higher the high temperature dissociation properties.

Among such organic carboxylates, Santacid G (dialkyl vinyl ether block bifunctional polymer type carboxylic acid), Santacid H (monoalkyl vinyl ether block bifunctional low molecular weight type carboxylic acid), Santacid I (monoalkyl vinyl ether block bifunctional carboxylic acid) (each manufactured by NOF Corporation), and the like may be preferably used.

The content of the flux (D) is at least 0.1 part by weight and at most 10 parts by weight, preferably at least 0.5 part by weight and at most 5 parts by weight per 100 parts by weight of the resin (A). If the content is less than 0.1 part by weight, solder connection failure may occur due to a decrease in the oxide film removability, and if it exceeds 10 parts by weight, connection failure may occur due to an increase in the viscosity of the composition.

The first interlayer filler composition may contain various other additives for the purpose of further improving its functions, within a range not to impair the effects of the present invention.

Such other additives may, for example, be a coupling agent such as a silane coupling agent or a titanate coupling agent, as an additive component to improve the bonding property to a substrate or the bonding property between the matrix resin and the inorganic filler, an ultraviolet inhibitor to improve the storage stability, an antioxidant, a plasticizer, a flame retardant, a coloring agent or a dispersing agent.

Each of these additives may be used alone or as a mixture of at least two in optional combination and proportion.

Among the above additives, with a view to improving the adhesion between the resin component and the inorganic filler (B), a coupling agent is preferably contained.

A silane coupling agent may, for example, be an epoxysilane such as γ-glycidoxypropyltrimethoxysilane, γ-glycidoxypropyltriethoxysilane or β-(3,4-epoxycyclohexyl)ethyltrimethoxysilane; an aminosilane such as γ-aminopropyltriethoxysilane, N-β(aminoethyl)γ-aminopropyltrimethoxysilane, N-β(aminoethyl)γ-aminopropylmethyldimethoxysilane, γ-aminopropyltrimethoxysilane or γ-ureido propyltriethoxysilane; a mercaptosilane such as 3-mercaptopropyltrimethoxysilane; a vinylsilane such as p-styryltrimethoxysilane, vinyltrichlorosilane, vinyltris(β-methoxyethoxy)silane, vinyltrimethoxysilane, vinyltriethoxysilane or γ-methacryloxypropyltrimethoxysilane, or a polymer type silane such as an epoxy type, an amino type or a vinyl type.

Further, a titanate coupling agent may, for example, be isopropyltriisostearoyl titanate, isopropyltri(N-aminoethyl-aminoethyl)titanate, diisopropylbis(dioctyl phosphate)titanate, tetraisopropylbis(dioctyl phosphite)titanate, tetraoctylbis(ditridecyl phosphite)titanate, tetra(2,2-diallyloxymethyl-1-butyl)bis(ditridecyl)phosphite titanate, bis(dioctyl pyrophosphate)oxyacetate titanate or bis(dioctyl pyrophosphate)ethylene titanate.

The amount of such other additives is not particularly limited, and they are used in amounts for a conventional resin composition to such an extent that necessary functions are obtained.

Among such other additives, the addition amount of the coupling agent is preferably from about 0.01 to about 2.0 wt %, more preferably from 0.1 to 1.5 wt % to the total solid content in the resin composition. If the amount of the coupling agent is small, no sufficient effect of improving the adhesion between the matrix resin and the inorganic filler by blending the coupling agent may be obtained, and if it is too large, the coupling agent may bleed out from the obtainable cured product.

[Organic Solvent (E)]

To form the first interlayer filler layer, the above-described first interlayer filler composition may be applied as it is on the semiconductor substrate, or may be used in the form of a coating fluid containing an organic solvent (E). Now, the organic solvent (E) will be described.

The organic solvent (E) which can be used may, for example, be a ketone such as acetone, methyl ethyl ketone (MEK), methyl isobutyl ketone (MIBK), methyl amyl ketone (MAK) or cyclohexanone (CHN), an ester such as ethyl acetate or butyl acetate; an ether such as ethylene glycol monomethyl ether, propylene glycol monomethyl ether or propylene glycol monomethyl ether acetate; an amide such as N,N-dimethylformamide or N,N-dimethylacetamide; an alcohol such as methanol or ethanol; an alkane such as hexane or cyclohexane; or an aromatic compound such as toluene or xylene.

Among them, considering the solubility of the resin, the boiling point of the solvent, and the like, preferred is a ketone such as methyl ethyl ketone, methyl isobutyl ketone or cyclohexanone, an ester or an ether, particularly preferred is a ketone such as methyl ethyl ketone, methyl isobutyl ketone or cyclohexanone.

Such organic solvents may be used alone or as a mixture of at least two in optional combination and proportion.

The mixing ratio of the organic solvent (E) to the other components is not particularly limited, but is preferably at least 20 wt % and at most 70 wt %, particularly preferably at least 30 wt % and at most 60 wt % to the other composition. By using the coating fluid of the present invention having such a mixing ratio, a favorable coating film can be formed by an optional coating method.

If the mixing ratio of the organic solvent (E) is less than 20 wt %, the viscosity of the composition tends to increase, and no favorable coating film may be obtained in some cases, and if it exceeds 70 wt %, problems may arise such that no predetermined film thickness will be obtained.

The coating fluid may contain various additives.

Such additives may, for example, be the above-described additives, and a surfactant to improve the dispersibility of the respective components in the coating fluid, an emulsifier, an elasticity-lowering agent, a diluent, an antifoaming agent or an ion trapping agent.

As the surfactant, any one of known anionic surfactant, nonionic surfactant and cationic surfactant may be used.

For example, a polyoxyethylene alkyl ether, a polyoxyethylene alkyl aryl ether, a polyoxyethylene alkyl ester, a sorbitan alkyl ester, a monoglyceride alkyl ester, an alkylbenzene sulfonate, an alkylnaphthalene sulfonate, an alkyl sulfate, an alkyl sulfonate, a sulfosuccinate, an alkylbetain or an amino acid may, for example, be mentioned.

Further, a fluorinated surfactant having some or all of C—H bonds in such a surfactant converted to C—F bonds may also be preferably used.

The amount of addition of the surfactant is preferably from about 0.001 to 5 wt %, more preferably from 0.01 to 1 wt % to all the solid content in the resin composition. If it is less than 0.001 wt %, no desired film thickness uniformity may be obtained in some cases, and if it exceeds 5 wt %, phase separation with the resin component may occur in some cases, such being unfavorable.

The method for preparing the coating fluid is not particularly limited, a known method may be employed, and the coating fluid can be prepared by mixing the constituting components for the coating fluid as they are.

Unless there are some special problems such as the reaction by the additives or the like or formation of precipitates by addition of the additives, the order of mixing the respective components is optional, and any two or more components among the components constituting the coating fluid may be preliminarily blended and then the other components are mixed, or all the components may be mixed all at once.

As described above, the inorganic filler (B) is preferably ground so that the inorganic filler (B) is not in the form of aggregates having large particle sizes, and it may be ground before production of the coating fluid, or may be ground after mixed with other components. The method of grinding the inorganic material is not particularly limited, and a conventional grinding method may be employed.

(1-3) First Three-Dimensional Integrated Circuit Laminate

The first three-dimensional integrated circuit laminate comprising the semiconductor substrate laminate is produced by a process comprising a step of forming a coating film of the first interlayer filler composition to be a precursor of the first interlayer filler layer on each of the semiconductor substrates each having a semiconductor layer formed thereon, constituting the respective layers of the three-dimensional integrated circuit, and a step of subjecting these semiconductor substrates by pressure bonding to form a semiconductor substrate laminate having first interlayer filler layers between the semiconductor substrates.

Now, the respective steps will be specifically described.

First, on the upper side and the lower side of each semiconductor substrate having a semiconductor device layer formed thereon, solder bumps and land terminals as electric connection terminals between substrates are formed as the case requires. The semiconductor substrate, the solder bumps and the land terminals are as described above.

Then, a coating film of the interlayer filler composition is formed on the semiconductor substrate.

The coating film of the first interlayer filler composition can be formed by applying the first interlayer filler composition dissolved or dispersed in the organic solvent (E) by a dipping method, a spin coating method, a spray coating method, a blade coating method or another optional method. To remove the solvent and low molecular weight components from the obtained coating film, baking treatment is carried out at an optional temperature of from 50 to 150° C., preferably from 60 to 130° C. to form a coating film, followed by B-stage formation as the case requires. On that occasion, a baking treatment may be carried out at a constant temperature, or a baking treatment may be carried out under reduced pressure conditions so that removal of volatile components in the composition smoothly proceeds. Further, within a range where curing of the resin does not proceed, a baking treatment by stepwise temperature increase may be carried out. For example, a baking treatment initially at 60° C., then at 80° C. and further at 120° C. each for from about 5 to about 90 minutes may be carried out.

Further, the first interlayer filler composition containing no organic solvent (E) may be used as it is. For example, using the interlayer filler composition heated and melted within a temperature range within which curing of the resin does not start, a film of the first interlayer filler composition may be formed on the semiconductor substrate by an optional method.

Further, since the first interlayer filler composition has sufficient extensibility suitable for film formation, the interlayer filler composition may be formed into a film, and the film is placed on the semiconductor substrate.

Then, the film comprising the first interlayer filler composition formed by the above method is heated to develop tack properties, and temporary boding to a semiconductor substrate to be bonded is carried out. The temporary boding temperature depends on the composition of the resin (A) and is preferably from 80 to 150° C. In a case where a plurality of semiconductor substrates are to be bonded, temporary bonding may be repeatedly carried out for the respective substrates, or a plurality of substrates having the coating film formed thereon are overlaid, and they are temporarily bonded by heating all together. For the temporary boding, as the case requires, a load of preferably from 1 gf/cm$^2$ to 50 Kgf/cm$^2$, more preferably from 10 gf/cm$^2$ to 10 Kgf/cm$^2$ is preferably applied to the substrates.

After the temporary boding, main bonding of the semiconductor substrates is carried out. The temporarily boded semiconductor substrates are pressure bonded at 200° C. or higher, preferably at 220° C. or higher, whereby the melt viscosity of the resin in the first interlayer filler composition is lowered to accelerate connection of electric terminals between the semiconductor substrates and at the same time, the flux in the composition is activated to realize solder bonding between the semiconductor substrates. The upper limit of the heating temperature is a temperature at which the resin (A) used is not decomposed or denatured, is properly determined by the type and the grade of the resin, and is usually at most 300° C.

Further, at the time of pressure bonding, as the case requires, a load of preferably from 10 gf/cm$^2$ to 10 Kgf/cm$^2$, more preferably from 50 gf/cm$^2$ to 5 Kgf/cm$^2$ is preferably applied to the substrates.

(2) Second Three-Dimensional Integrated Circuit Laminate

In the second three-dimensional integrated circuit laminate of the present invention, the above-described semiconductor substrate laminate is further mounted on an organic substrate, and between the semiconductor substrate laminate and the organic substrate, a second interlayer filler layer containing a resin (a) and an inorganic filler (b) may be formed.

That is, the second three-dimensional integrated circuit laminate is a three-dimensional integrated circuit laminate wherein the above-described semiconductor substrate laminate (the first three-dimensional integrated circuit laminate) is further mounted on an organic substrate, and a second interlayer filler layer containing a resin (a) and an inorganic filler (b) is formed between the semiconductor substrate laminate and the organic substrate.

Figure 3:
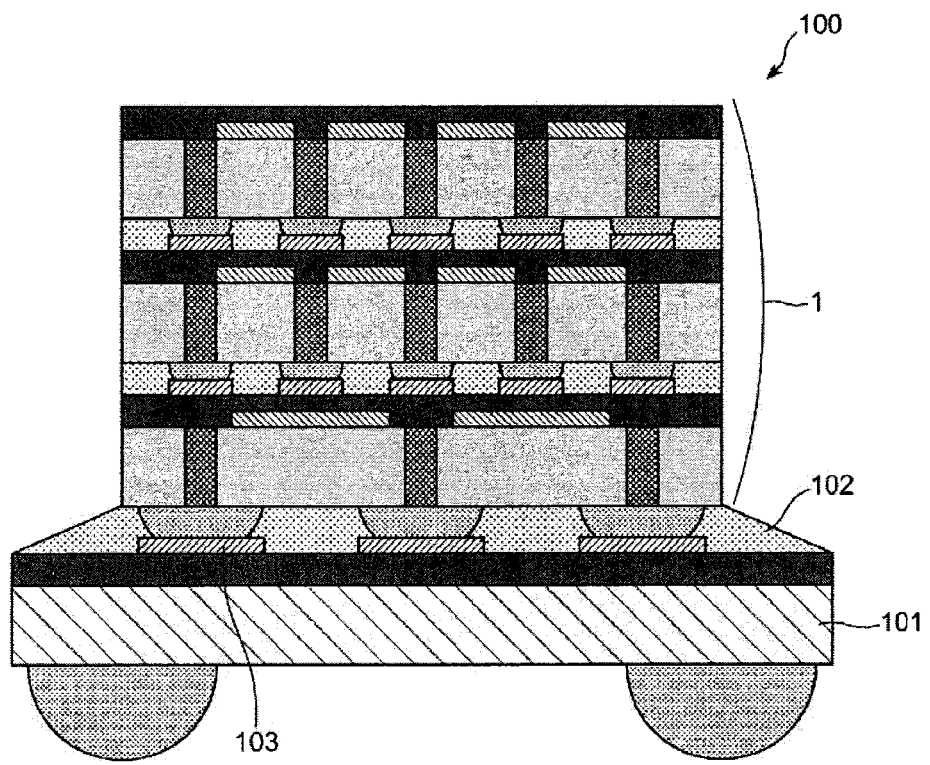
FIG. 3 is a cross-sectional view conceptually illustrating a three-dimensional integrated circuit laminate according to a second embodiment of the present invention (second three-dimensional integrated circuit laminate).

In FIG. 3, a cross-sectional view conceptually illustrating a three-dimensional integrated circuit laminate according to a second embodiment of the present invention (hereinafter referred to as a second three-dimensional integrated circuit laminate). In FIG. 3, for easy understanding of the structure of the three-dimensional integrated circuit laminate, the thickness and the size of constituents relative to the semiconductor substrates and the organic substrate are indicated larger than the actual sizes.

As shown in FIG. 3, in a second three-dimensional integrated circuit laminate 100, the above-described semiconductor substrate laminate 1 is further mounted on an organic substrate 101, and between the semiconductor substrate laminate and the organic substrate, a second interlayer filler layer 102 containing a resin (a) and an inorganic filler (b) is formed.

Now, the second three-dimensional integrated circuit laminate will be described in detail. Description for the semiconductor substrate laminate is omitted since it is the same as the above-described first three-dimensional integrated circuit laminate.

(2-1) Organic Substrate

The organic substrate is a pattern conversion substrate (interposer) for high density packaging to connect an electrode array employing solder balls as external electrodes to a semiconductor substrate, and is preferably an organic substrate having a multilayer circuit structure having a wiring layer in a resin plate, so as to secure the conformity in the thermal expansion with a printed circuit board or a flexible substrate at the time of packaging of the three-dimensional integrated circuit laminate. An epoxy resin or the like is preferably used as a resin component constituting the organic substrate, and copper (Cu) is preferably used as a wiring layer. The semiconductor substrate laminate mounted on a printed circuit board via the second interlayer filler layer, may be connected to the organic substrate via the solder bumps or the like, and the organic substrate may be electrically connected to terminals of the printed circuit board via the electrode array.

(2-2) Second Interlayer Filler Layer

The second interlayer filler layer is formed between the semiconductor substrate laminate and the organic substrate and contains a resin (a) and an inorganic filler (b).

The second interlayer filler layer has a coefficient of linear thermal expansion of preferably at least 10 ppm/K and at most 50 ppm/K, particularly preferably at most 15 ppm/K. The coefficient of linear thermal expansion is preferably lower, but is usually at least 20 ppm/K.

When the coefficient of linear thermal expansion is at least 10 ppm/K and at most 50 ppm/K, a stress formed due to a difference in the coefficient of expansion by heat between the semiconductor substrate laminate and the organic substrate will be relaxed, and separation at the bonding interface between the semiconductor substrate laminate and the organic substrate can be avoided.

The dielectric constant of the second interlayer filler layer is preferably at most 6, more preferably at most 5, particularly preferably at most 4.5. The dielectric constant is preferably lower, but is usually at least 3.

If the dielectric constant exceeds 6, the signal transmission delays in wiring between the semiconductor substrate laminate and the organic substrate may occur, thus leading to a decrease in the operating speed of the entire device, such being unfavorable. When the dielectric constant is at most 6, preferably at most 5, the above signal transmission delays can be reduced, and the operation speed of a semiconductor device can be improved.

Of the second interlayer filler layer, the thermal conductivity is preferably at least 0.4 W/(m·K), more preferably at least 0.8 W/(m·K), particularly preferably at least 1.0 W/(m·K). The thermal conductivity is preferably higher, and is usually at most 10 W/(m·K).

The difference in the coefficient of thermal expansion between the semiconductor substrate laminate and the organic substrate becomes significant as the temperature becomes high, and when the thermal conductivity of the second interlayer filler layer is at least 0.4 W/(m·K), heat generated will sufficiently be transmitted to the organic substrate via the second interlayer filler layer, whereby operation failure due to accumulation of heat in the semiconductor substrate laminate can more securely be avoided and in addition, the stress formed due to a difference in the coefficient of expansion will be relaxed.

The thickness of the second interlayer filler layer is preferably at least 50 μm and at most 300 μm, more preferably at least 60 μm and at most 250 μm, further preferably at least 70 μm and at most 200 μm.

If the thickness increases, the laminate of the semiconductor substrate laminate and the organic substrate tends to be bulky, and small packaging will be difficult, such being unfavorable. Further, if the thickness is small, due to a difference in the coefficient of expansion between the semiconductor substrate laminate and the organic substrate by a change in the operating temperature of the device, e.g. separation at the bonding interface between the inorganic and organic substrates may occur, such being unfavorable. By the above thickness, both processability and performance can be satisfied.

Now, the respective components in a composition comprising the second interlayer filler layer (hereinafter sometimes referred to as a second interlayer filler composition) will be described.

The second interlayer filler composition comprises a resin (a) and an inorganic filler (b) and as the case requires, contains a curing agent (c), a flux (d) or the like.

Detailed description of the constituents in the second interlayer filler composition which are the same as in the first interlayer filler composition is omitted.

[Resin (a)]

Of the resin (a), the thermal conductivity is preferably at least 0.15 W/(m·K), more preferably at least 0.3 W/(m·K), in order that sufficient thermal conductivity is obtained when combined with the inorganic filler (b) as the second interlayer filler composition. The thermal conductivity is preferably higher, but is usually at most 0.5 W/(m·K).

Further, the resin (a) has a melt viscosity at 50° C. of preferably at least 2,000 Pa·s, more preferably at least 10,000 Pa·s to carry out positioning to a substrate to be bonded before temporary bonding after formation of a thin film on the substrate.

Further, when main bonding is carried out after temporary bonding, in order to melt the first interlayer filler composition by heating to connect electric connection terminals, the resin (a) has a melt viscosity at 120° C. of preferably at most 100 Pa·s, more preferably at most 20 Pa·s.

The resin (a) may, for example, be specifically an epoxy resin, a phenol resin, a urea resin, a melamine resin, a benzoguanamine resin, a polyester resin, an allyl resin, an alkyl resin, a urethane resin, a silicon resin, an acrylic resin or a polyimide resin.

Further, as the resin (a), the above resin (A) of the first interlayer filler composition may be used.

Among such resins, preferred is a thermosetting resin excellent in the heat resistance and various electric properties. Among thermosetting resins, preferred is a resin containing an epoxy resin as the main component in view of the processability before curing, other curing properties, physical properties of a cured film, etc. Here, "containing an epoxy resin as the main component" means that the proportion of the epoxy resin in the resin (a) is at least 50 wt %, preferably at least 60 wt % (including 100 wt %).

As a technique to fill a space between a silicon substrate and an organic substrate, commonly an underfilling process has been proposed, by which the space is filled with an interlayer filler from the side of the substrates by employing capillarity after bonding the bumps and lands. Accordingly, in this process, a resin component which is liquid at room temperature is necessary, and usually, a liquid epoxy resin or the like is preferably used.

[Inorganic Filler (b)]

The inorganic filler (b) is added so as to improve the thermal conductivity of the second interlayer filler composition. By the second interlayer filler composition containing the inorganic filler (b) having a thermal conductivity, high thermal conductivity can be imparted to the second interlayer filler composition, whereby thermal conduction between the semiconductor substrate laminate and the organic substrate can be accelerated and the temperature of the semiconductor device substrate can be lowered, and accordingly the semiconductor device can be operated stably.

The thermal conductivity of the inorganic filler (b) is preferably at least 1 W/(m·K), more preferably at least 2 W/(m·K). The thermal conductivity is preferably higher, but is usually at most 300 W/(m·K).

By the inorganic filler (b) having such a thermal conductivity, the second interlayer filler layer having sufficient thermal conductivity can be obtained with an appropriate addition amount.

As the inorganic filler (b), the same filler as the above-described inorganic filler (b) may be used.

That is, alumina ($Al_2O_3$, thermal conductivity: 30 W/(m·K)), aluminum nitride (AlN, thermal conductivity: 260 W/(m·K)), boron nitride (BN, thermal conductivity: 3 W/(m·K) (thickness direction), 275 W/(m·K) (in-plane direction)), silicon nitride ($Si_3N_4$, thermal conductivity: 23 W/(m·K)) or silica ($SiO_2$, thermal conductivity: 1.4 W/(m·K)) or the like may be used.

Such inorganic fillers (b) may be used alone or as a mixture of at least two in optional combination and proportion.

The inorganic filler (b) preferably further has both stability against oxygen, water and exposure to high temperature and a low dielectric property, in view of the reliability of a device bonded. Such an inorganic filler may be $Al_2O_3$, AlN, BN or $SiO_2$, preferably $Al_2O_3$, AlN or BN.

The particle size of the inorganic filler (b) is not particularly limited, and usually, the average particle size is from 0.1 to 20 μm and the maximum particle size is 30 μm, preferably the average particle size is from 0.2 to 17 μm and the average particle size is 25 μm, more preferably the average particle size is from 0.3 to 15 μm and the maximum particle size is 20 μm.

The content of the inorganic filler (b) is usually at least 50 parts by weight and at most 400 parts by weight, more preferably at least 75 parts by weight and at most 300 parts by weight per 100 parts by weight of the resin (a). If the content of the inorganic filler (b) is less than 50 parts by weight, no sufficient thermal conductivity is obtained in some cases, and if it exceeds 400 parts by weight, the viscosity of the composition tends to be high, and a problem such that no uniform coating film can be formed may arise.

[Other Components]

In the second interlayer filler composition, components other than the resin (a) and the inorganic filler (b) may be the curing agent (C), the flux (D) and other additives in the above-described first interlayer composition. The purpose of use, the blend amounts and the like of them are the same as in the first interlayer filler composition.

(2-3) Second Three-Dimensional Integrated Circuit Laminate

The second three-dimensional integrated circuit laminate is produced by a process comprising a step of forming a coating film of the second interlayer filler composition to be a precursor of the second interlayer filler layer on one or both of the surface of the semiconductor substrate laminate on the side where it is in contact with the organic substrate, and the surface of the organic substrate on the side where it is in contact with the semiconductor substrate laminate, and a step of subjecting the semiconductor substrate and the organic substrate to pressure bonding to form a semiconductor substrate laminate having a second interlayer filler layer between the semiconductor substrate laminate and the organic substrate.

The second interlayer filler composition may be the same as the first interlayer filler composition or may be different.

EXAMPLES

Now, the present invention will be described in further detail with reference to Examples. However, it should be understood that the present invention is by no means restricted to the following Examples within the scope of the present invention.

The components blended in the interlayer filler composition will be described below.

(1) Resin (A)

Epoxy resin (A1): phenoxy resin (weight average molecular weight: 26,000, epoxy equivalent: 4,600 g/equivalent, 30 wt % methyl ethyl ketone/cyclohexanone solution (in a volume ratio of 50:50))

Epoxy resin (A2-1): Bisphenol F liquid epoxy resin, tradename "jER1750", manufactured by Mitsubishi Chemical Corporation Epoxy resin (A2-2): "YL6800", tradename, manufactured by Mitsubishi Chemical Corporation Epoxy resin (A2-3): "1032H60", tradename, manufactured by Mitsubishi Chemical Corporation Epoxy resin (A2-4): "1001", tradename, manufactured by Mitsubishi Chemical Corporation Epoxy resin (A2-5): "YX4000", tradename, manufactured by Mitsubishi Chemical Corporation Epoxy resin (A2-6): "1006", product name, manufactured by Mitsubishi Chemical Corporation Epoxy resin (A3): "156S65", tradename, manufactured by Mitsubishi Chemical Corporation Reactive diluting agent (A4): 1,6-hexanediol diglycidyl ether, "YED216D", tradename, manufactured by Yokkaichi Chemical Company Limited (2) Inorganic Filler (B)

Inorganic filler (B-1): BN (boron nitride), "R-BN", tradename, manufactured by NISSIN REFRATEC CO., LTD.

Inorganic filler (B-2): BN, "AP-170S", tradename, manufactured by MARUKA

Inorganic filler (B-3): Silica, "PLV-4", tradename, manufactured by Tasumori Ltd.

(3) Curing Agent (C)

Curing agent (C-1): 2-ethyl-4(5)-methylimidazole, "jER-CURE EMI24", tradename, manufactured by Mitsubishi Chemical Corporation Curing Agent (C-2): 2-phenyl-4,5-dihydroxymethylimidazole, "2PHZ-PW", tradename, manufactured by Shikoku Chemicals Corporation (4) Flux (D)

Flux (D-1): Dialkyl vinyl ether block bifunctional polymer type carboxylic acid, "Santacid G", tradename, manufactured by NOF Corporation Flux (D-2): "Adipic acid", tradename, manufactured by Wako Pure Chemical Industries, Ltd.

(5) Organic Solvent (E)

Methyl ethyl ketone: manufactured by Wako Pure Chemical Industries, Ltd. (special grade chemical)

Cyclohexanone: manufactured by Wako Pure Chemical Industries, Ltd. (special grade chemical)

(6) Dispersing Agent (F)

Dispersing agent (F-1): "BYK-2155", product name, manufactured by BYK Japan KK

The phenoxy resin as the epoxy resin (A1) was prepared as follows.

215 parts by weight of YL6121H (epoxy equivalent: 171 g/equivalent, a 1:1 mixture of 4,4'-biphenol type epoxy resin and 3,3',5,5'-tetramethyl-4,4'-biphenol type epoxy resin, manufactured by Mitsubishi Chemical Corporation), 127 parts by weight of 3,3'-dimethyl-4,4'-biphenol (OH equivalent: 107 g/equivalent, manufactured by Honshu Chemical Industry Co., Ltd.), 0.32 part by weight of a 27 wt % tetramethylammonium hydroxide aqueous solution and 228 parts by weight of cyclohexanone as a reaction solvent were put in a pressure resistant reactor equipped with a stirrer, and a reaction was carried out in a nitrogen gas atmosphere at 180° C. for 5 hours. Then, 171 parts by weight of cyclohexanone and 399 parts by weight of methyl ethyl ketone as solvents for dilution were added to adjust the solid content concentration. The solvents were removed from the reaction product by an usual method to obtain a 30 wt % resin solution.

The average particle size of the inorganic filler (B) in the resin, the specific surface area, and the thermal conductivity of the interlayer filler composition were measured by the following methods.

(Measurement Methods)

(1) Average particle size of inorganic filler (B) in resin 2 mL of cyclohexanone was added to 4 mg of a mixture paste of the epoxy resin/the inorganic filler before addition of the curing agent, followed by ultrasonic treatment for 10 minutes, and using a particle size distribution measuring apparatus ("LA920", tradename, manufactured by Horiba, Ltd.), the particle size distribution was measured by a batch cell using cyclohexanone as a solvent. From the obtained particle size distribution, the average particle size and the maximum particle size of the inorganic filler (B) after grinding were determined. The average particle size was on the volume basis, and the relative refractive index was 1.20.

(2) Specific Surface Area of Inorganic Filler (B)

A pretreatment of nitrogen gas flow at 250° C. for 15 minutes was applied to the inorganic filler, and then the specific surface area was measured by a single-point BET method (absorption gas: nitrogen) using Macsorb HM Model-1201 manufactured by Mountech Co., Ltd.

Physical properties of the obtained resin and the interlayer filler composition were measured by the following methods.

The thermal conductivity of the resin and the interlayer filler composition was determined by measuring the thermal diffusivity, the specific gravity and the specific heat by the following apparatus and multiplying these three measured values. Further, the coefficient of linear thermal expansion was determined by a tensile method (load: 5 gf) in a nitrogen atmosphere.

Thermal conductivity=thermal diffusivity×specific gravity×specific heat (1) Thermal diffusivity: measured by "ai-Phase Mobile 1μ", tradename, manufactured by ai-Phase Co., Ltd.

(2) Specific gravity: measured by balance XS-204 manufactured by Mettler-Toredo International Inc. (using "solid specific gravity measuring kit")

(3) Specific heat: specific heat at 25° C. was determined by software of a differential scanning calorimeter ("DSC7"), tradename, manufactured by Perkin Elmer Co., Ltd. at a temperature-raising rate of 10° C./min, or the specific heat was determined by DSC320/6200, tradename, manufactured by Seiko Instruments Inc.

(4) Coefficient of linear thermal expansion: determined by using TMA-50, tradename, manufactured by Shimadzu Corporation, as an average value at from −10° C. to 40° C.

Example 1

45 parts by weight of epoxy resin (A2-1), 5 parts by weight of reactive diluting agent (A4) and 50 parts by weight of inorganic filler (B-1) were mixed, and the mixture was passed through a three-roll mill of which the roll distance was adjusted to 10 μm five times to obtain a mixture paste of the epoxy resin/the inorganic filler.

The average particle size of the inorganic filler (B-1) in the mixture paste of the epoxy resin/the inorganic filler was 0.6 μm. Further, the specific surface area of the inorganic filler (B-1) was 9.69 $m^2/g$.

5 parts by weight of curing agent (C-1) was added to 100 parts by weight of the mixture paste of the epoxy resin/the inorganic filler, followed by mixing by a rotary and revolutionary mixing apparatus ("Awatori Rentaro", tradename, manufactured by THINKY CORPORATION) at 2,000 revolutions under conditions of mixing for 5 minutes and bubble removal for one minute.

The mixed paste was sandwiched between glass plates subjected to release treatment with a silicon rubber sheet having a thickness of 500 μm as a spacer, and heated at 140° C. for one hour and further heated at 150° C. for 4 hours to obtain an interlayer filler composition film (interlayer filler layer). Of this film, the thermal conductivity was 1.2 W/(m·K), and the dielectric constant was 3.2. The dielectric constant was calculated from the volume fraction of the filler component in the interlayer filler composition based on the dielectric constants (epoxy resin: 2.8, boron nitride: 3.9) of the respective materials.

Example 2

The same operation as in Example 1 was carried out except that inorganic filler (B-2) was used instead of inorganic filler (B-1) in Example 1.

The average particle size of the inorganic filler (B-2) by the above measurement method was 4.1 μm. Further, the specific surface area of the inorganic filler (B-2) was 16 $m^2/g$.

Of the obtained interlayer filler composition film, the thermal conductivity was 0.5 W/(m·K) and the dielectric constant was 3.2. Further, the dielectric constant was calculated from the volume fraction of the filler component in the interlayer filler composition based on the dielectric constants (epoxy resin: 2.8, boron nitride: 3.9) of the respective materials.

Example 3

As epoxy resin (A), 5 g of the epoxy resin (A1) solution, 3.75 g of epoxy resin (A2-2), 0.94 g (80 wt % cyclohexanone solution) of epoxy resin (A2-3), 2.14 g (70 wt % cyclohexanone solution) of epoxy resin (A2-4), 7.24 g of inorganic filler (B-1) and further, 24.0 g of zirconia balls (YTZ-2) having a diameter of 2 mm were added, followed by stirring by a rotary and revolutionary stirring machine at 2,000 rpm for 33 minutes. After completion of stirring, the beads were removed by filtration, and 0.15 g of curing agent (C-2) and 0.15 g of flux (D-1) were added, followed by further stirring by a rotary and revolutionary stirring machine for 6 minutes to obtain an interlayer filler paste (coating fluid).

The particle size distribution of inorganic filler (B-1) in the obtained interlayer filler paste after stirring was measured, whereupon the average particle size was 1.0 μm and the maximum particle size was 5.9 μm.

This material paste was applied to a glass substrate subjected to release treatment and heated under reduced pressure at 100° C. for 90 minutes to remove the solvent thereby to obtain a B-stage film. On this film, a glass substrate subjecting to release treatment was further placed to sandwich the B-stage film, followed by pressing (pressure: 1 MPa) at 150° C. for one hour and then at 170° C. for one hour to form and cure the film to obtain an interlayer filler composition film having a film thickness of 500 μm. The thermal conductivity of this film was 1.1 W/(m·K). The coefficient of linear thermal expansion was 33 ppm/K. The dielectric constant was 3.2. The dielectric constant was calculated from the volume fraction of the filler component in the interlayer filler composition based on the dielectric constants (epoxy resin: 2.8, boron nitride: 3.9) of the respective materials.

Comparative Example 1

As epoxy resin (A), 5 g of the epoxy resin (A1) solution, 3.75 g of epoxy resin (A2-2), 0.94 g (80 wt % cyclohexanone solution) of epoxy resin (A2-3) and 2.14 g (70 wt % cyclohexanone solution) of epoxy resin (A2-4), and 7.24 g of inorganic filler (B-1) were added, followed by stirring by a rotary and revolutionary stirring machine at 2,000 rpm for 5 minutes to obtain an interlayer filler paste (coating fluid). The particle size distribution of the inorganic filler (B-1) in the obtained interlayer filler paste after stirring was measured by the same apparatus as in Example 32, whereupon the maximum particle size was larger than 10 μm.

Using this interlayer filler paste, the B-stage film was obtained in the same manner as in Example 3. On the obtained B-stage film, the filler was visually confirmed in many points, and the film was non-uniform. The coefficient of linear thermal expansion of this film was 33 ppm/K. The dielectric constant was 3.2. The dielectric constant was calculated from the volume fraction of the filler component in the interlayer filler composition based on the dielectric constants (epoxy resin: 2.8, boron nitride: 3.9) of the respective materials.

Example 4

As epoxy resin (A), 5 g of epoxy resin (A1) solution, 5.25 g of epoxy resin (A2-2), 0.94 g (80 wt % cyclohexanone solution) of epoxy resin (A2-3), and 7.24 g of inorganic filler (B-1), and further, 23.3 g of zirconia balls (YTZ-2) having a diameter of 2 mm were added, followed by stirring by a rotary and revolutionary stirring machine at 2,000 rpm for 33 minutes. After completion of stirring, the beads were removed by filtration, and 0.15 g of curing agent (C-2) and 0.15 g of flux (D-1) were added, followed by further stirring by a rotary and revolutionary stirring machine for 6 minutes to obtain an interlayer filler paste (coating fluid).

This material paste was applied to a glass substrate subjected to release treatment and heated under reduced pressure at 100° C. for 90 minutes to distill the solvent off to form a B-stage film. On this film, a glass substrate subjected to release treatment was further placed to sandwich the film, followed by pressing (pressure: 1 MPa) at 150° C. for one hour and further at 170° C. for one hour to form and cure the film to obtain an interlayer filler composition film having a film thickness of 600 μm. Of this film, the thermal conductivity was 1.0 W/(m·K), and the coefficient of linear thermal expansion was 31 ppm/K. The dielectric constant was 3.2. The dielectric constant was calculated from the volume fraction of the filler component in the interlayer filler composition based on the dielectric constants (epoxy resin: 2.8, boron nitride: 3.9) of the respective materials.

Comparative Example 2

As epoxy resin (A), 6 g (80 wt % MEK solution) of epoxy resin (A3) was added to 5 g of the epoxy resin (A1) solution, followed by stirring by a rotary and revolutionary stirring machine for 6 minutes. 0.12 g of flux (D-1) was added thereto, followed by further stirring by a rotary and revolutionary stirring machine for 6 minutes to obtain an interlayer filler paste (coating fluid).

This material paste was applied to a glass substrate subjected to release treatment and heated under reduced pressure for 100° C. for 90 minutes to distill the solvent off to form a B-stage film. On this film, a glass substrate subjected to release treatment was further placed to sandwich the film, followed by pressing (pressure: 1 MPa) at 150° C. for 3 hours to form and cure the film to obtain an interlayer filler composition film having a film thickness of 500 μm. Of this film, the thermal conductivity was 0.2 W/(m·K), and the coefficient of linear thermal expansion was at least 100 ppm/K.

Example 5

As epoxy resin (A), 5 g of the epoxy resin (A1) solution, 3.75 g of epoxy resin (A2-2), 0.94 g (80 wt % cyclohexanone solution) of epoxy resin (A2-3), 2.14 g (70 wt % cyclohexanone solution) of epoxy resin (A2-4), and 7.24 g of inorganic filler (B-1) and further 24.0 g of zirconia balls (YTZ-2) having a diameter of 2 mm were added, followed by stirring by a rotary and revolutionary stirring machine at 2,000 rpm for 33 minutes. After completion of stirring, the beads were removed by filtration, and 0.15 g of curing agent (C-2) and 0.15 g of flux (D-1) were added, followed by further stirring by a rotary and revolutionary stirring machine for 6 minutes to obtain an interlayer filler paste (coating fluid).

This material paste was applied to a glass substrate subjected to release treatment and heated under reduced pressure at 100° C. for 90 minutes to distill the solvent off to form a B-stage film. On this film, a glass substrate subjected to release treatment was further placed to sandwich the film, followed by pressing (pressure: 1 MPa) at 150° C. for one hour and then at 170° C. for one hour to form and cure the film to obtain an interlayer filler composition film having a film thickness of 600 μm.

Of this film, the thermal conductivity was 1.2 W/(m·K), the coefficient of linear thermal expansion was 33 ppm/K, and the dielectric constant was 3.2.

The dielectric constant was calculated from the volume fraction of the filler component in the interlayer filler composition based on the dielectric constants (epoxy resin: 2.8, boron nitride: 3.9) of the respective materials.

Example 6

As epoxy resin (A), 5 g of the epoxy resin (A1) solution, 3.75 g of epoxy resin (A2-2), 0.94 g (80 wt % cyclohexanone solution) of epoxy resin (A2-3), 2.14 g (70 wt % cyclohexanone solution) of epoxy resin (A2-4), and 7.74 g of inorganic filler (B-1) and further 24.6 g of zirconia balls (YTZ-2) having a diameter of 2 mm were added, followed by stirring by a rotary and revolutionary stirring machine at 2,000 rpm for 33 minutes. After completion of stirring, the beads were removed by filtration, and 0.15 g of curing agent (C-2) and 0.15 g of flux (D-1) were added, followed by further stirring by a rotary and revolutionary stirring machine for 6 minutes to obtain an interlayer filler paste (coating fluid).

This material paste was applied to a glass substrate subjected to release treatment and heated under reduced pressure at 100° C. for 90 minutes to distill the solvent off to form a B-stage film. On this film, a glass substrate subjected to release treatment was further placed to sandwich the film, followed by pressing (pressure: 1 MPa) at 150° C. for one hour and then at 170° C. for one hour to form and cure the film to obtain an interlayer filler composition film having a film thickness of 500 μm.

Of this film, the thermal conductivity was 1.0 W/(m·K), the coefficient of linear thermal expansion was 33 ppm/K, and the dielectric constant was 3.2.

The dielectric constant was calculated from the volume fraction of the filler component in the interlayer filler composition based on the dielectric constants (epoxy resin: 2.8, boron nitride: 3.9) of the respective materials.

Example 7

In the same manner as in Example 6 except that silica (B-3) was used as inorganic filler (B), the film was formed and cured to obtain an interlayer filler composition film. The thermal conductivity of this cured film was 0.4 W/(m·K).

Example 8

2.50 g of epoxy resin (A2-3), 6.25 g of epoxy resin (A2-5) and 3.75 g of epoxy resin (A2-6) were dissolved in 12.5 g of methyl ethyl ketone by stirring. To this solution, 0.25 g of dispersing agent (F-1), 0.25 g of flux (D-2) and 11.75 g of methyl ethyl ketone were added, and further, 12.5 g of inorganic filler (B-1) and 100 g of zirconia balls (YTZ-0.5) having a diameter of 0.5 mm were added, followed by stirring by a rotary and revolutionary stirring machine at 2,000 rpm for 10 minutes. After completion of stirring, the beads were removed by filtration, and 0.25 g of curing agent (C-2) was added, followed by further stirring by a rotary and revolutionary stirring machine for 6 minutes to obtain an interlayer filler paste (coating fluid). The average particle size and the maximum particle size of the inorganic filler (B-1) in the obtained interlayer filler paste after stirring were measured, whereupon the average particle size was 4 μm and the maximum particle size was 9 μm.

25 μL of this interlayer filler paste was applied to a solder bump substrate (CC80 Model1) made of silicon manufactured by WALTS, and sequentially heated at 60° C. for 15 minutes, at 80° C. for 15 minutes and at 120° C. for 30 minutes on a hot plate to dissolved the solvent off. Further, heating was carried out at 150° C. for 10 minutes on the hot plate to form a B-stage film.

This solder bump substrate and an organic interposer (CC80 Model1) manufactured by WALTS were bonded by contact bonding under heating to 250° C. using a flip chip bonder (FC3000S) manufactured by Toray Engineering Co., Ltd., and after cooling, a post annealing treatment was carried out at 165° C. for 2 hours to form a laminate. The electric resistance of a daisy chain in the interior of the laminate was measured, whereupon it was at most 10Ω.

Further, the same interlayer filler paste was applied to a glass substrate subjected to release treatment and sequentially heated under reduced pressure at 80° C. for 30 minutes and at 120° C. for 30 minutes to distill the solvent off. On the film, a glass substrate subjected to release treatment was further placed to sandwich the film, followed by pressing at 165° C. for 2 hours under a pressure of 1 MPa to form and cure the film to obtain an interlayer filler composition film having a film thickness of 500 μm.

Of this film, the thermal conductivity was 1.1 W/(m·K), the coefficient of linear thermal expansion was 34 ppm/K, and the dielectric constant was 3.2. The dielectric constant was calculated from the volume fraction of the filler component in the interlayer filler composition based on the dielectric constants (epoxy resin: 2.8, boron nitride: 3.9) of the respective materials.

Example 9

In the same manner as in Example 8, a laminate was formed, and the electric resistance of a daisy chain in the interior of the laminate was measured, whereupon it was at most 10Ω.

This laminate was placed on a hot plate at 120° C. so that the interposer substrate faced downward, and the temperature over which the surface temperature of the silicon substrate increased from 25° C. to 100° C. was measured, whereupon it was 2.4 seconds.

Example 10

In the same manner as in Example 8, a laminate was formed, and the electric resistance of a daisy chain in the interior of the laminate was measured, whereupon it was at most 10Ω.

This laminate was placed firstly on a plate at −55° C., then a plate at 23° C., further on a plate at 125° C. and finally on a plate at 23° C. each for 10 seconds, and this cycle was repeated five times to apply thermal shock. After this operation, the electric resistance of a daisy chain in the interior of the laminate was measured, whereupon it was at most 20Ω.

Example 11

An interlayer filler paste prepared in the same manner as in Example 8 was applied to a glass substrate subjected to release treatment and sequentially heated under reduced pressure at 80° C. for 30 minutes and then at 120° C. for 30 minutes to distill the solvent off. On the film, a glass substrate subjected to release treatment was further placed to sandwich the film, followed by pressing at 165° C. for 2 hours under a pressure of 1 MPa to form and cure the film to obtain an interlayer filler composition film having a film thickness of 500 μm.

This cured film was dried in a vacuum oven at 125° C. for 5 hours to obtain a cured film having a film weight of 1.6179 g after drying. Then, this cured film was held in a constant temperature constant humidity oven at 85° C. under 85% for 10 hours, and then the weight of the film was measured, whereupon the weight of the cured film was 1.6303 g, and the weight increase ratio by water absorption was 0.77%, which is less than 1% and good.

INDUSTRIAL APPLICABILITY

With the three-dimensional integrated circuit laminate of the present invention excellent in the heat dissipation property and the reliability, an electronic device capable of stably operating a semiconductor device can be obtained, and the present invention is very useful.

This application is a continuation of PCT Application No. PCT/JP2012/058676, filed on Mar. 30, 2012, which is based upon and claims the benefit of priority from Japanese Patent Application No. 2011-080752 filed on Mar. 31, 2011, Japanese Patent Application No. 2011-080753 filed on Mar. 31, 2011, Japanese Patent Application No. 2011-080754 filed on Mar. 31, 2011, Japanese Patent Application No. 2011-080755 filed on Mar. 31, 2011, and Japanese Patent Application No. 2011-080756 filed on Mar. 31, 2011. The contents of those applications are incorporated herein by reference in its entirety.

REFERENCE SYMBOLS

1: First three-dimensional integrated circuit laminate
10, 20, 30: Semiconductor substrate
11, 21, 31: Semiconductor device layer
12, 22, 32: Buffer coat film
13, 23, 33: Semiconductor substrate through-hole electrode
14, 24, 34, 103: Land terminal
15, 25, 35: Solder bump
40, 50: First interlayer filler layer
100: Second three-dimensional integrated circuit laminate
101: Organic substrate
102: Second interlayer filler layer

What is claimed is:

1. A three-dimensional integrated circuit laminate, which comprises a semiconductor substrate laminate having at least two semiconductor substrates each having a semiconductor device layer formed thereon laminated, has a first interlayer filler layer containing a resin (A) and an inorganic filler (B) and having a thermal conductivity of at least 0.8 W/(m·K) between the semiconductor substrates, and has a second interlayer filler layer coma a resin (a) and an inorganic filler (b) is formed between the semiconductor substrate laminate and the organic substrate, wherein the semiconductor substrate laminate is mounted on an organic substrate, said first interlayer filler layer is obtained from a composition containing from 50 to 400 parts by weight of an inorganic filler (B), from 0.1 to 60 parts by weight of a curing agent (C) and from 0.1 to 10 parts by weight of a flux (D) per 100 parts by weight of a resin (A), the resin (A) is a plurality of epoxy resins differing in the structural units in combination, and the inorganic filler (B) has an average particle size of at least 0.1 μm and at most 10 μm, a maximum particle size of at most 10 μm, and a thermal conductivity of at least 2 W/(m·K).

2. The three-dimensional integrated circuit laminate according to claim 1, wherein the coefficient of linear thermal expansion of the first interlayer filler layer is at least 3 ppm/K and at most 70 ppm/K.

3. The three-dimensional integrated circuit laminate according to claim 1, wherein the dielectric constant of the inorganic filler (B) contained in the first interlayer filler layer is at most 6.

4. A three-dimensional integrated circuit laminate, which comprises a semiconductor substrate laminate having at least two semiconductor substrates each having a semiconductor device layer formed thereon laminated, has a first interlayer filler layer containing a resin (A) and an inorganic filler (B) and having a coefficient of linear thermal expansion of at least 3 ppm/K and at most 70 ppm/K between the semiconductor substrates, and has a second interlayer filler layer containing a resin (a) and an inorganic filler (b) is formed between the semiconductor substrate laminate and the organic substrate, wherein the semiconductor substrate laminate is mounted on an organic substrate, and the inorganic filler (B) having an average particle size of at least 0.1 μm and at most 10 μm and a maximum particle size of 10 μm, wherein said first interlayer filler layer is obtained from a composition containing from 50 to 400 parts by weight of an inorganic filler (B), from 0.1 to 60 parts by weight of a curing agent (C) and from 0.1 to 10 parts by weight of a flux (D) per 100 parts by weight of a resin (A), the resin (A) is a plurality of epoxy resins differing in the structural units in combination, and the inorganic filler (B) has an average particle size of at least 0.1 μm and at most 10 μm, a maximum particle size of at most 10 μm, and a thermal conductivity of at least 2 W/(m·K).

5. A three-dimensional integrated circuit laminate, which comprises a semiconductor substrate laminate having at least two semiconductor substrates each having a semiconductor device layer formed thereon laminated, has a first interlayer filler layer containing a resin (A) and an inorganic filler (B) between the semiconductor substrates, and has a second interlayer filler layer containing a resin (a) and an inorganic filler (b) is formed between the semiconductor substrate laminate and the organic substrate, wherein the semiconductor substrate laminate is mounted on an organic substrate, and the inorganic filler (B) having an average particle size of at least 0.1 μm and at most 10 μm, a maximum particle size of 10 μm, and a dielectric constant of at most 6, wherein said first interlayer filler layer is obtained from a composition containing from 50 to 400 parts by weight of an inorganic filler (B), from 0.1 to 60 parts by weight of a curing agent (C) and from 0.1 to 10 parts by weight of a flux (D) per 100 parts by weight of a resin (A), the resin (A) is a plurality of epoxy resins differing in the structural units in combination, and the inorganic filler (B) has an average particle size of at least 0.1 μm and at most 10 μm, a maximum particle size of at most 10 μm, and a thermal conductivity of at least 2 W/(m·K).

6. The three-dimensional integrated circuit laminate according to claim 1, wherein the specific surface area of the inorganic filler (B) contained in the first interlayer filler layer between the semiconductor substrates is at least 1 m²/g and at most 60 m²/g.

7. The three-dimensional integrated circuit laminate according to claim 1, wherein the semiconductor substrates are silicon substrates.

8. The three-dimensional integrated circuit laminate according to claim 1, wherein of the inorganic filler (B), the average particle size is at least 0.2 μm and at most 5 μm, and the specific surface area is at least 1 m²/g and at most 25 m²/g.

9. The three-dimensional integrated circuit laminate according to claim 1, wherein the inorganic filler (B) is boron nitride.

10. The three-dimensional integrated circuit laminate according to claim 1, wherein the thickness of the first interlayer filler layer is at least 1 μm and at most 50 μm.

11. The three-dimensional integrated circuit laminate according to claim 1, which has solder connection terminals for electric signal connection between the semiconductor substrates each having a semiconductor device layer formed thereon in the first interlayer filler layer.

12. The three-dimensional integrated circuit laminate according to claim 1, wherein the organic substrate has a multilayer circuit structure having a wiring layer containing copper in a resin plate containing an epoxy resin as a resin component.

13. The three-dimensional integrated circuit laminate according to claim 1, wherein the second interlayer filler layer contains the inorganic filler (b) in an amount of at least 50 parts by weight and at most 400 parts by weight per 100 parts by weight of the resin (a).

14. The three-dimensional integrated circuit laminate according to claim 1, wherein the coefficient of linear thermal expansion of the second interlayer filler layer is at least 10 ppm/K and at most 50 ppm/K.

15. The three-dimensional integrated circuit laminate according to claim 1, wherein the dielectric constant of the second interlayer filler layer is at most 6.

16. The three-dimensional integrated circuit laminate according to claim 1, wherein the inorganic filler (b) has an average particle size of at least 0.1 µm and at most 20 µm, a maximum particle size of 30 µm, a specific surface area of at least 1 m2/g and at most 60 m2/g, a thermal conductivity of at least 1 W/(m·K), and a dielectric constant f at most 6.

17. The three-dimensional integrated circuit laminate according to claim 1, wherein the resin (A) is a plurality of epoxy resins containing at least a phenoxy resin and differing in the structural units in combination.

18. The three-dimensional integrated circuit laminate according to claim 1, wherein thickness of the second interlayer filler layer is at least 50 µm and at most 300 µm.

19. The three-dimensional integrated circuit laminate according to claim 1, wherein the first interlayer filler layer and the second interlayer filler layer have a different composition.

20. The three-dimensional integrated circuit laminate according to claim 4, wherein the first interlayer filler layer and the second interlayer filler layer have a different composition.

21. The three-dimensional integrated circuit laminate according to claim 5, wherein the first interlayer filler layer and the second interlayer filler layer have a different composition.

22. The three-dimensional integrated circuit laminate according to claim 1, wherein the flux (D) has a melt temperature of from 90° C. to 220° C.

23. The three-dimensional integrated circuit laminate according to claim 4, wherein the flux (D) has a melt temperature of from 90° C. to 220° C.

24. The three-dimensional integrated circuit laminate according to claim 5, wherein the flux (D) has a melt temperature of from 90° C. to 220° C.

* * * * *